United States Patent
Furukawa et al.

(10) Patent No.: US 7,625,450 B2
(45) Date of Patent: Dec. 1, 2009

(54) FILM FORMING APPARATUS

(75) Inventors: Shinji Furukawa, Machida (JP);
Masahiro Shibamoto, Yokohama (JP)

(73) Assignee: Canon Anelva Corporation, Kawasaki-Shi (JP)

( * ) Notice: Subject to any disclaimer, the term of this patent is extended or adjusted under 35 U.S.C. 154(b) by 695 days.

(21) Appl. No.: 10/957,864

(22) Filed: Oct. 4, 2004

(65) Prior Publication Data
US 2005/0115830 A1 Jun. 2, 2005

(30) Foreign Application Priority Data
Oct. 15, 2003 (JP) ............... 2003-355471

(51) Int. Cl.
*C23C 14/00* (2006.01)
*C25B 11/00* (2006.01)
*C25B 13/00* (2006.01)
*B05B 5/025* (2006.01)
*C23C 16/00* (2006.01)

(52) U.S. Cl. ............... 118/719; 118/632; 118/729; 204/298.02

(58) Field of Classification Search ............... 118/719; 156/345.51; 198/465.1; 204/192.2, 192.32, 204/298.25; 438/680, 689; 700/245
See application file for complete search history.

(56) References Cited

U.S. PATENT DOCUMENTS

| 5,324,360 | A | * | 6/1994 | Kozuka ............... 118/719 |
| 5,780,313 | A | * | 7/1998 | Yamazaki ............... 438/689 |
| 5,820,723 | A | * | 10/1998 | Benjamin et al. ...... 156/345.51 |
| 5,846,328 | A | | 12/1998 | Aruga et al. |
| 6,235,634 | B1 | * | 5/2001 | White et al. ............... 438/680 |
| 6,251,232 | B1 | * | 6/2001 | Aruga et al. ........... 204/192.32 |
| 6,517,691 | B1 | * | 2/2003 | Bluck et al. ............ 204/298.25 |
| 7,234,584 | B2 | * | 6/2007 | Rice et al. ............... 198/465.1 |

(Continued)

FOREIGN PATENT DOCUMENTS

JP 8-274142 10/1996

(Continued)

OTHER PUBLICATIONS

Japanese Office Action dated Apr. 10, 2009 (3 pages), and English translation thereof (5 pages), issued in counterpart Japanese Application Serial No. 2003-355471.

*Primary Examiner*—Jennifer K Michener
*Assistant Examiner*—Michael Band
(74) *Attorney, Agent, or Firm*—Frishauf, Holtz, Goodman & Chick, P.C.

(57) ABSTRACT

The invention provides a multi-film forming apparatus including a substrate holder stock chamber for storing a plurality of substrate holders separately from a path in the multi-film forming apparatus, so that production can be performed without being affected by the process of removing a film accumulated on the surface of the substrate holder and the process of replacing the substrate holder, or by the process of removing a film accumulated on the surface of the substrate holder or the process of replacing the substrate holder, and hence high-throughput production is possible. A branch path is provided on the path of the multi-film forming apparatus, and a substrate holder stock chamber for storing a plurality of substrate holders which enables retrieval of the substrate holder from the path and feeding of the substrate holder to the path is provided.

13 Claims, 21 Drawing Sheets

U.S. PATENT DOCUMENTS 7,243,003 B2 * 7/2007 Rice et al. .................. 700/245
2003/0159919 A1 * 8/2003 Fairbairn et al. ......... 204/192.2

FOREIGN PATENT DOCUMENTS

| | | |
|---|---|---|
| JP | 9-180281 | 7/1997 |
| JP | 10-199958 | 7/1998 |
| JP | 2000-273615 A | 10/2000 |
| JP | 2001-156158 A | 6/2001 |
| JP | 2001-335916 | 12/2001 |

* cited by examiner

FILM FORMING APPARATUS

BACKGROUND OF THE INVENTION

1. Field of the Invention

The present invention relates to a film forming apparatus and, more specifically, to a film forming apparatus which can perform a film forming process on a substrate to be processed without being affected by replacement of a substrate holder and by a process of removing a film accumulated on the substrate holder.

2. Description of the Related Art

In a production film forming apparatus for forming a film by moving a substrate holder in which a substrate is held, the film forming process is performed repeatedly while replacing a substrate in the substrate holder, having completed a predetermined film forming process, with a new substrate. While the film forming process is performed on the substrate, the film is accumulated not only on the substrate, but also on a substrate holding claw of the substrate holder and a portion therearound. Therefore, after repeated usage of the substrate holder, the film is thickly accumulated on the substrate holder, particularly on the substrate holding claw and the portion therearound, whereby a problem such that the quality of film formation on the substrate is lowered due to separation of the accumulated film is resulted.

In order to prevent or alleviate such a problem, a film forming apparatus which removes the film accumulated on the substrate holder in a film removing chamber provided separately so as to be branched from a path in the film forming apparatus in which a plurality of vacuum chambers are provided in series is disclosed in JP-A-2000-273615 (Patent Document 1). According to the Patent Document 1, an accumulated film on the surface of a single substrate holder is removed in a film removing chamber 41, as shown in FIG. 19.

Also, a film forming apparatus which removes an accumulated film on a substrate holder by providing a film removing mechanism on a homeward passage of a transfer mechanism provided between a load lock chamber and an unload lock chamber is disclosed in JP-A-2001-156158 (Patent Document 2).

However, with the film removing method described above, it is difficult to remove the accumulated film on the surface of the substrate holder efficiently without affecting a series of film forming process when the thickness of the accumulated film on the surface of the substrate holder increases. In particular, when a vertical magnetic recording system is employed for meeting the need of high density recording media in recent years, the film to be formed is thick, and hence the problem described above becomes obvious. Consequently, the necessity to perform replacement of the substrate holder frequently arises.

As described above, in a vertical magnetic recording film forming apparatus, the substrate holder is replaced every one or two days for preventing generation of particles caused by separation of the film accumulated on the substrate holding claw of the substrate holder or the portion therearound as matters stand.

In the film forming apparatus in the related art, substrate holders from which the accumulated film are removed and cleaned or new substrate holders (hereinafter, referred to as "new substrate holder") are stored in a degasificated state in a vacuum heating degasificating furnace provided externally of the apparatus. After having retrieved, or during retrieval of, the substrate holders which need to be replaced from the apparatus, degasificated new substrate holders are retrieved once from the degasificating furnace into atmospheric air, and fed one by one to the film forming apparatus. However, there arrive problems such that the film forming apparatus having fed with the new substrate holders needs significant time for evacuating air until a predetermined pressure required for film formation is established, and that a significant time is required for re-degasification, which is generally required to be done again, in a heating chamber before actually starting production. In particular, when replacing a plurality of substrate holders, these problems become obvious.

In the film forming apparatus shown in Patent Document 1, removal of accumulated film can be performed without affecting the film forming process as long as the film on the substrate holder is thin. However, when a thick film is formed as described above, there arises a problem of timing for returning new substrate holders back to the path in the film forming apparatus, and hence the film forming process is disturbed and efficient production cannot be achieved.

In the film forming apparatus in Patent Document 2, the film removing mechanism is provided in the path in the film forming apparatus. Therefore, when the thickness of the film accumulated on the substrate holder increases, the time required for the entire film forming process is increased by time required for the processing in the film removing mechanism. As a consequence, productivity is lowered. Also, when attempt is made to perform film removing process without affecting the film forming process, the film cannot be removed satisfactorily.

SUMMARY OF THE INVENTION

Accordingly, it is an object of the present invention to provide a film forming apparatus which can manufacture substrates efficiently without being affected by the process of removing films accumulated on the surfaces of substrate holders and the process of replacing the substrate holders, or the process of removing films accumulated on the surfaces of substrate holders or the process of replacing the substrate holders, by providing a substrate holder stock chamber for storing a plurality of substrate holders in a path in the film forming apparatus.

The film forming apparatus according to the present invention is a film forming apparatus for forming a film on the surfaces of substrates while transferring substrate holders holding the substrates along a path in vacuum chambers including: a substrate holder stock chamber being connected so as to be capable of communicating with and of kept sealed hermetically with vacuum in film forming chambers in the film forming apparatus via a gate valve, wherein the substrate holders are retrieved and fed by a retrieving mechanism for retrieving the substrate holders from the path and a feeding mechanism for feeding the substrate holders to the path without exposing the substrate holders in atmospheric air.

The substrate holder stock chamber of the film forming apparatus according to the invention includes a degasificating mechanism.

The substrate holder stock chamber of the film forming apparatus according to the invention includes a film removing mechanism for removing a film accumulated on the surfaces of the substrate holders.

Retrieving and feeding of the substrate holders in the film forming apparatus according to the invention are performed by separate substrate holder stock chambers respectively.

The substrate holder stock chambers of the film forming apparatus according to the invention include a mechanism or mechanisms having a slide carrier capable of arranging the surfaces of the plurality of substrate holders in parallel and of moving linearly and vertically for feeding the substrate holders to, and/or retrieving the substrate holders from, the path in the film forming apparatus.

The substrate holder stock chambers of the film forming apparatus according to the invention include a mechanism arranging the plurality of substrate holders around a center axis of a rotating mechanism for feeding the substrate holders to, and/or retrieving the substrate holders from, the path in the film forming apparatus by means of the rotating mechanism.

The substrate holder stock chamber of the film forming apparatus according to the invention has a structure capable of being connected to a direction-changing chamber, which is a chamber for changing the direction of the substrate holders.

According to the invention, since the substrate holder stock chamber for storing the plurality of substrate holders is provided in the path in the film forming apparatus, so that the substrate holders are retrieved from the path and fed to the path while vacuum is retained, production can be performed without being affected by the process of replacing the substrate holder and the process of removing the film from the surface of the substrate holder, or by the process of replacing the substrate holder or the process of removing the film on the surface of the substrate holder. Therefore, time required for replacing the used substrate holder with the new ones is reduced, and efficient production is achieved.

Since the substrate holder stock chamber of the film forming apparatus according to the invention is provided with a degasificating mechanism, degasification can be performed without taking out the substrate holder into atmospheric air.

Since the substrate holder stock chamber of the film forming apparatus according to the invention can remove the accumulated film from the substrate holders in a separate route, generation of particles can be prevented without affecting the film forming process.

Since the substrate holder stock chamber of the film forming apparatus according to the invention includes an accumulated film removing mechanism and the accumulated film on the surface of the substrate holders can be removed without exposing the substrate holders in atmospheric air, re-evacuation of air from atmospheric air is not necessary, thereby improving the productivity.

The substrate holder stock chamber of the film forming apparatus according to the invention can be connected not only to the direction-changing chamber in the path, but also to the vacuum chamber, a load lock chamber, and an unload lock chamber. In particular, if the structure is such that a stock chamber for feeding substrate holders and a stock chamber for retrieving substrate holders are connected respectively to the two direction-changing chambers located close to each other for performing retrieving and feeding of the substrate holders independently, the productivity can further be improved.

DESCRIPTION OF THE PREFERRED EMBODIMENTS

Figure 1:
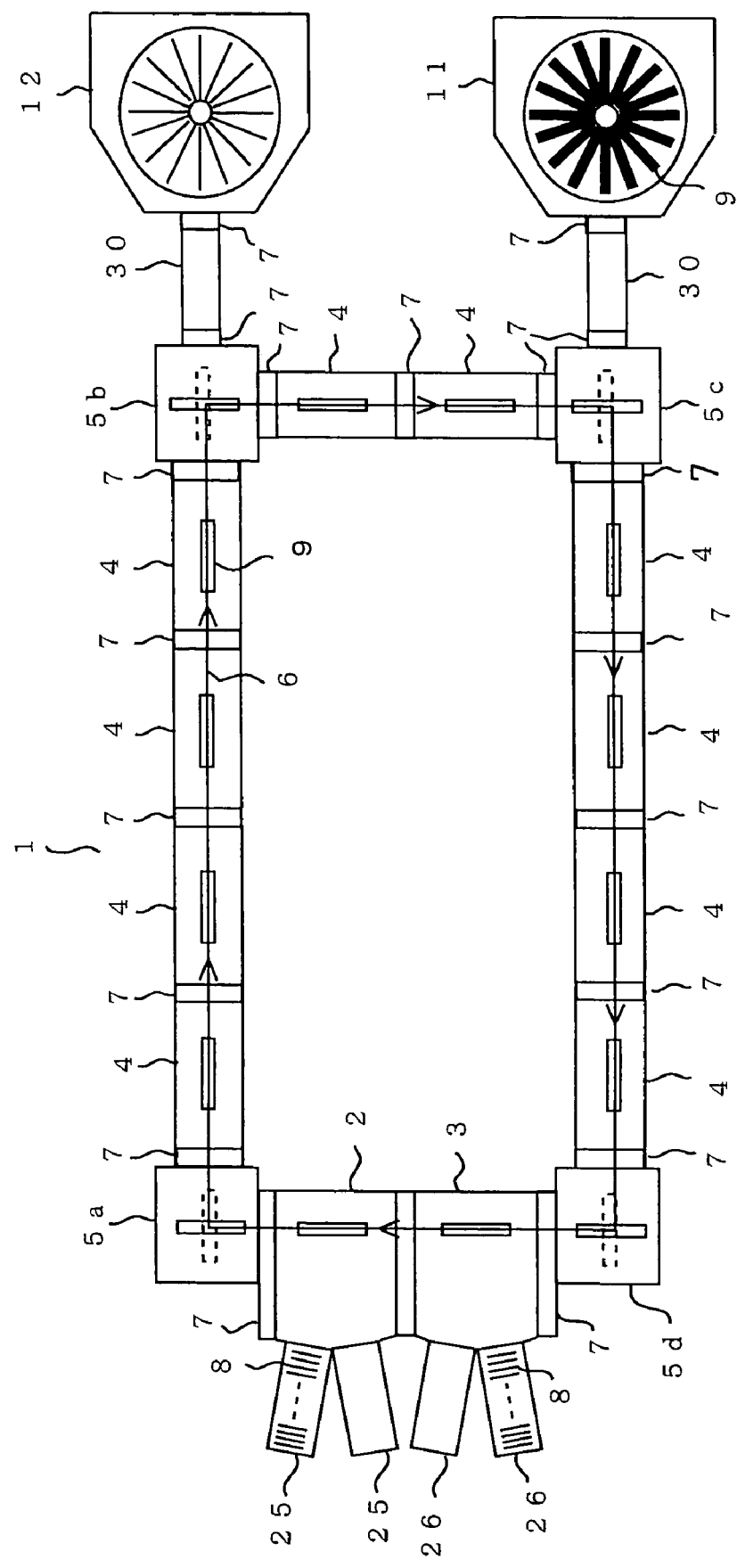
FIG. 1 is a drawing showing a general structure of a substrate processing apparatus for information storage disks as a film forming apparatus according to the invention.

Referring now to the drawings, a film forming apparatus according to the present invention will be described. The film forming apparatus according to the invention is configured in such a manner that a substrate holder stock chamber (hereinafter, referred simply as "stock chamber") for performing storage and feeding of a plurality of substrate holders is provided, so that a high operating ratio can be maintained by preventing lowering of the operating ratio of the apparatus due to the step of removing an accumulated substance attached on the substrate holders and replacing the substrate holder, or by the step of removing the accumulated substance attached on the substrate holders or replacing the substrate holder.

Figure 2:
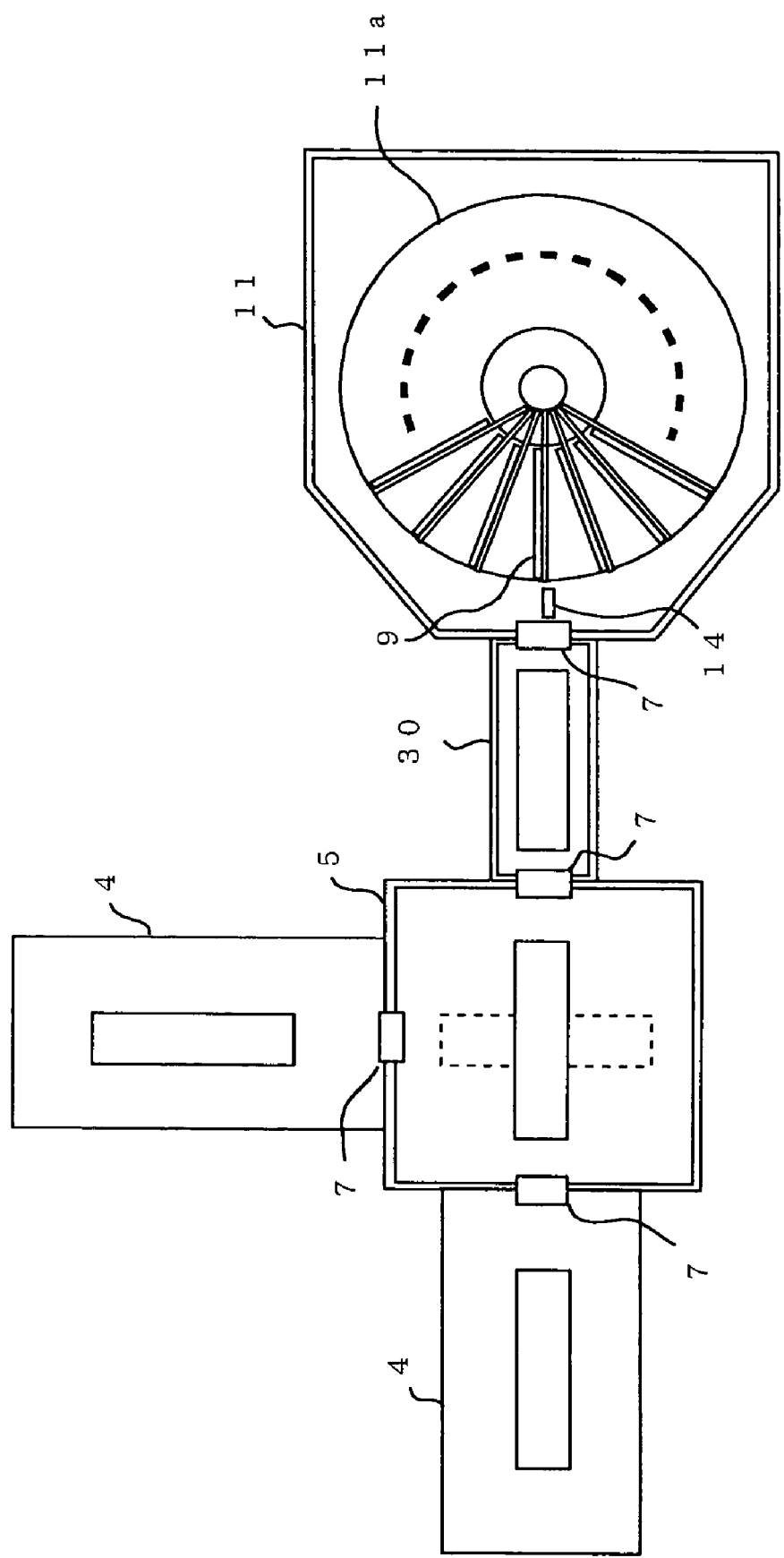
FIG. 2 is a schematic drawing showing a state in which a stock chamber is connected to a direction-changing chamber.
Figure 3:
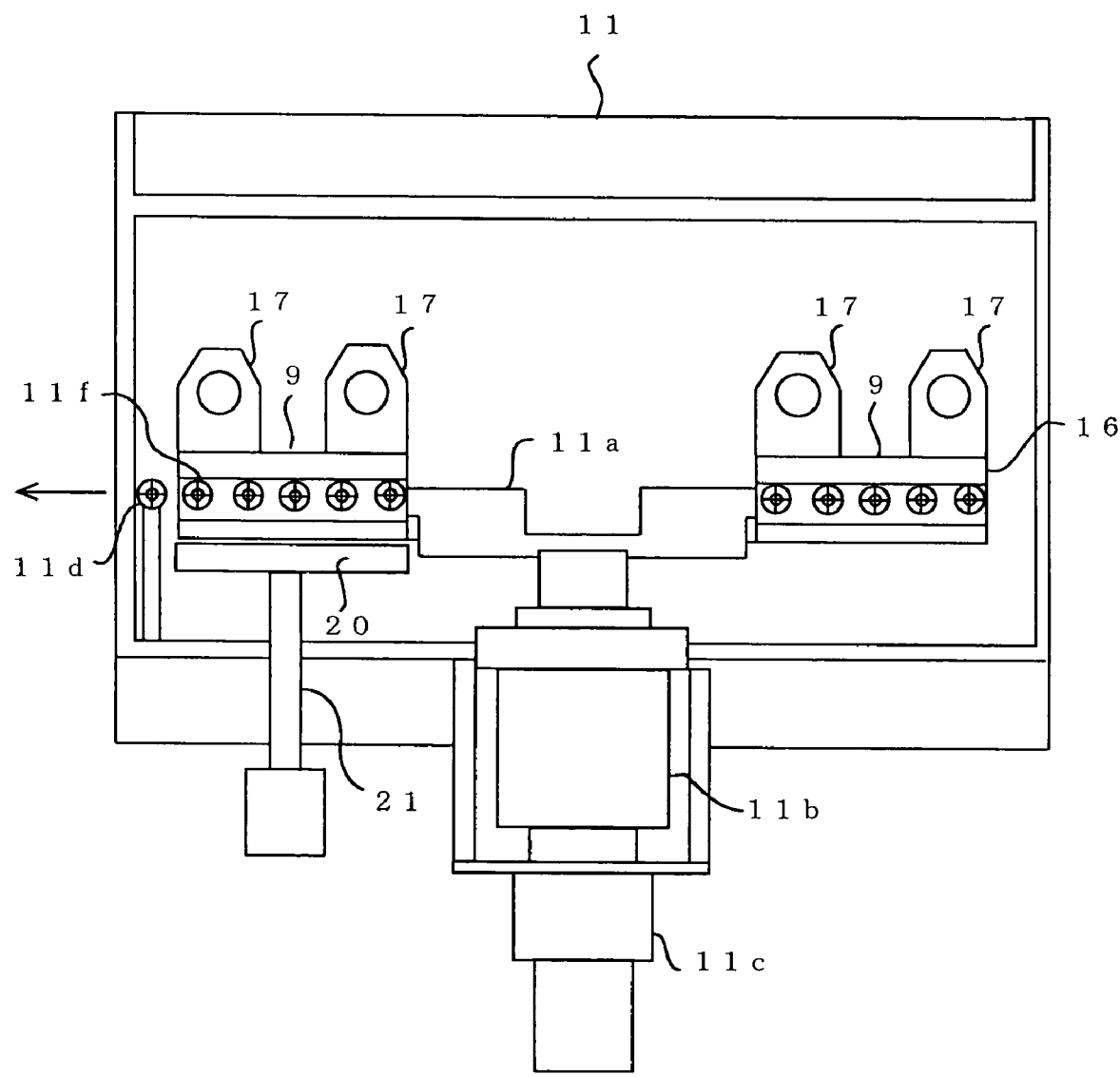
FIG. 3 is a side view of the stock chamber.

FIG. 1 is a drawing showing a general structure of a substrate processing apparatus for information storage disks as an example of the film forming apparatus according to the invention; FIG. 2 is a schematic drawing showing a state in which the stock chamber is connected to a direction-changing chamber; and FIG. 3 is a side view of the stock chamber.

As shown in FIG. 1, the substrate processing apparatus for information storage disk 1 as the film forming apparatus includes a load lock chamber 2 for mounting substrates 8 on which a film is not formed (including substrates on which preprocess is completed) to substrate holders 9, an unload lock chamber 3 for retrieving the substrates 8 on which the film is formed from the substrate holders 9, vacuum chambers 4 for performing various processes, direction-changing chambers 5a, 5b, 5c, 5d having direction-changing mechanisms for changing the transporting direction of the substrates 8 by 90 degrees; a rotary feeding stock chamber 11 for feeding new substrate holders 9 to a path 6, a rotary retrieving stock chamber 12 for retrieving and storing the used substrate holders 9, and the path 6 provided in the vacuum chambers 4 through which the substrate holders 9 holding the substrates 8 are transported. Provided between the adjacent vacuum chambers 4 are gate valves 7. The interior of each vacuum chamber 4 is vacuumed by an evacuating machine (not shown) and the respective vacuum chambers 4 are isolated by the gate valves 7 from each other so that sealed vacuum processing chambers are established. When the gate valves 7 are opened, the respective vacuum chambers 4 are brought into communication so that the substrate holder 9 can be transported from one to another. Therefore, as shown in FIG. 1, the path 6 is formed into a closed loop, and the interior of the path 6 is maintained in a vacuum state.

Also, as shown in FIG. 1, the path 6 of the substrate processing apparatus for information storage disks 1 as the film forming apparatus is, as described above, formed into the closed loop, and thus the substrate holders 9 on which substrate holder units 17 are mounted (shown in FIG. 4A) are circulated in the substrate processing apparatus for information storage disks 1.

Also, as shown in FIG. 1, the load lock chamber 2 includes a mounting robot (not shown) for mounting the substrates 8 to the substrate holders 9. The mounting robot is adapted to hold one or more substrates 8 from a mounting auxiliary chamber 25 by an arm and mount the same to the substrate holders 9. The unload lock chamber 3 is provided with a retrieving robot (not shown) having the same structure as the mounting robot. The retrieving robot is adapted to hold one or a plurality of substrates 8 from the substrate holders 9 by the arm thereof and transports them into a retrieving auxiliary chamber 26.

The vacuum chambers 4 for performing various processes include a substrate heating chamber for heating the substrate 8 in advance before forming a thin film, a base film forming chamber for forming a base film on the preheated substrate 8, a magnetic film forming chamber for forming a magnetic film on the substrate 8 on which the base film is formed, a protective film forming chamber for forming a protective film on the magnetic film, and so on, according to the process to be performed.

The direction-changing chambers 5 are provided at four positions (5a, 5b, 5c, 5d) at corners of the square path 6, and each are provided with the direction-changing mechanism for changing the transporting direction of the substrate holders 9 by 90 degrees.

The rotary feeding stock chamber 11 supplies stored new substrate holders 9 to the path 6. Referring to FIG. 2 and FIG. 3, the rotary feeding stock chamber 11 will be described in detail.

As shown in FIG. 2, the rotary feeding stock chamber 11 is connected to a joint transporting unit 30 via the gate valve 7, and is adapted to be connected from the joint transporting unit 30 to the direction-changing chamber 5 via the gate valve 7. The rotary feeding stock chamber 11 includes substrate holders 9 stored therein, and the substrate holders 9 are arranged radially at a predetermined angle with respect to the center of a circle in a vertically upright position.

As shown in FIG. 2, the joint transporting unit 30 stores the substrate holders 9 transported from the rotary feeding stock chamber 11 temporarily, feeds the same to the direction-changing chamber 5, and serves as a buffer between the rotary feeding stock chamber 11 and the direction-changing chamber 5. In the embodiment shown in FIG. 1, FIG. 2, FIG. 7, FIG. 8, FIG. 10, FIG. 11 and FIG. 13 to FIG. 18, the stock chamber and the joint transporting unit 30 are configured to be separate chambers with the intermediary of the gate valve 7. However, a stock chamber configured in such a manner that the gate valve is provided on the side of the film forming apparatus so as to be brought into communication by providing the path in the stock chamber may also be applicable.

As shown in FIG. 2 and FIG. 3, the rotary feeding stock chamber 11 includes the substrate holders 9 concentrically disposed on a rotatable rotary table 11a mounted therein. The center of the rotary table 11a is fixed to a revolving shaft, and the revolving shaft is connected to a gear box 11b. The other end of the gear box 11b is directly connected to a shaft of a motor 11c. When the motor 11c rotates, the rotary table 11a also rotates correspondingly. The motor 11c includes a rotary encoder integrated therein, and the rotary angle of the rotary table 11a can be detected from the number of pulses from the rotary encoder and the gear ratio of the gear box 11b. Also, a rotary magnet 20 and a rotating mechanism 21 for transporting the substrate holder 9 from a feeding guide 11d of the rotary feeding stock chamber 11 to the joint transporting unit 30 are disposed.

As shown in FIG. 3, the substrate holders 9 are mounted to a rotatable guide roller 11f. The substrate holders 9 are transported while being guided by guide rollers and pulleys provided in the path 6 and the joint transporting unit 30.

As shown in FIG. 3, the rotary feeding stock chamber 11 is provided with a vacuum evacuation mechanism (not shown) and a degasificating mechanism (not shown), so that degasification can be made without taking out the substrate holder into atmospheric air. In addition, by the provision of an accumulated film removing mechanism (not shown), removal of the accumulated film on the substrate holder unit 17 can be performed. The evacuation mechanism includes a cryo-pump or a turbo-molecular pump, so that the interior of the rotary feeding stock chamber 11 is evacuated to obtain a predetermined vacuum pressure or below. The degasificating mechanism heats up the substrate holder 9 to a predetermined temperature by a heater in a vacuum atmosphere or in a gas atmosphere having introduced inert gas, and discharges or removes gas generated from the surface of the substrate holder 9. It is also possible to degasify by generating glow discharge under the vacuum condition. The accumulated film removing mechanism introduces gas from a gas introducing pipe, not shown, into the chamber, and removes the accumulated film on the substrate holder unit 17 by plasma discharge generated by applying high-frequency voltage or DC voltage on an electrode, not shown, or on the substrate holder unit 17, or by spatter etching by the use of high-frequency discharge with the electrode or a negative bias electrode applied to the substrate holder unit 17.

As shown in FIG. 1, the rotary retrieving stock chamber 12 for retrieving and storing the used substrate holders 9 has the same structure as the rotary feeding stock chamber 11, and is adapted to store the substrate holders 9 from the joint transporting unit 30 in sequence.

The rotary feeding stock chamber 11 and the rotary retrieving stock chamber 12 are adapted to store the substrate holders 9 by the number more than those existing on the path 6 of the substrate processing apparatus for information storage disk 1.

Figure 4A:
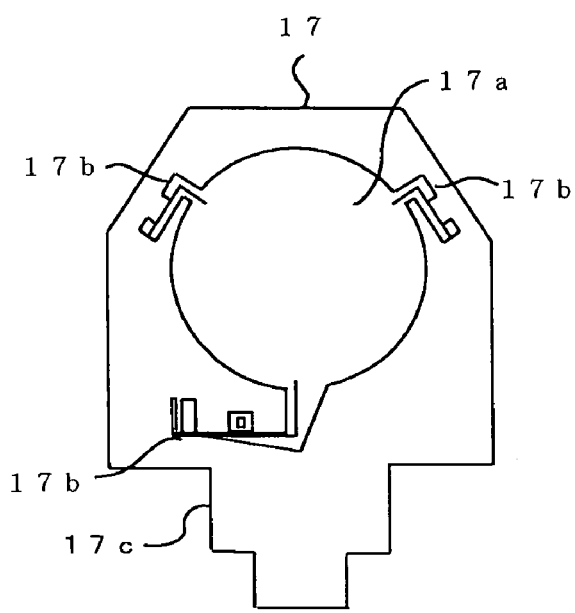
FIG. 4A is a front view showing a structure of a substrate holder unit.
Figure 4C:
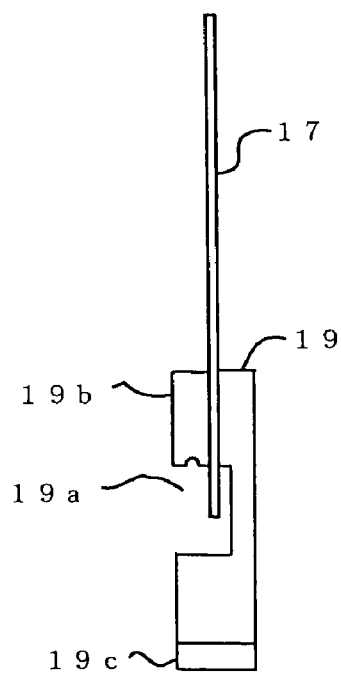
FIG. 4C is a cross-sectional view taken along the line A-A' in FIG. 4B.
Figure 4B:
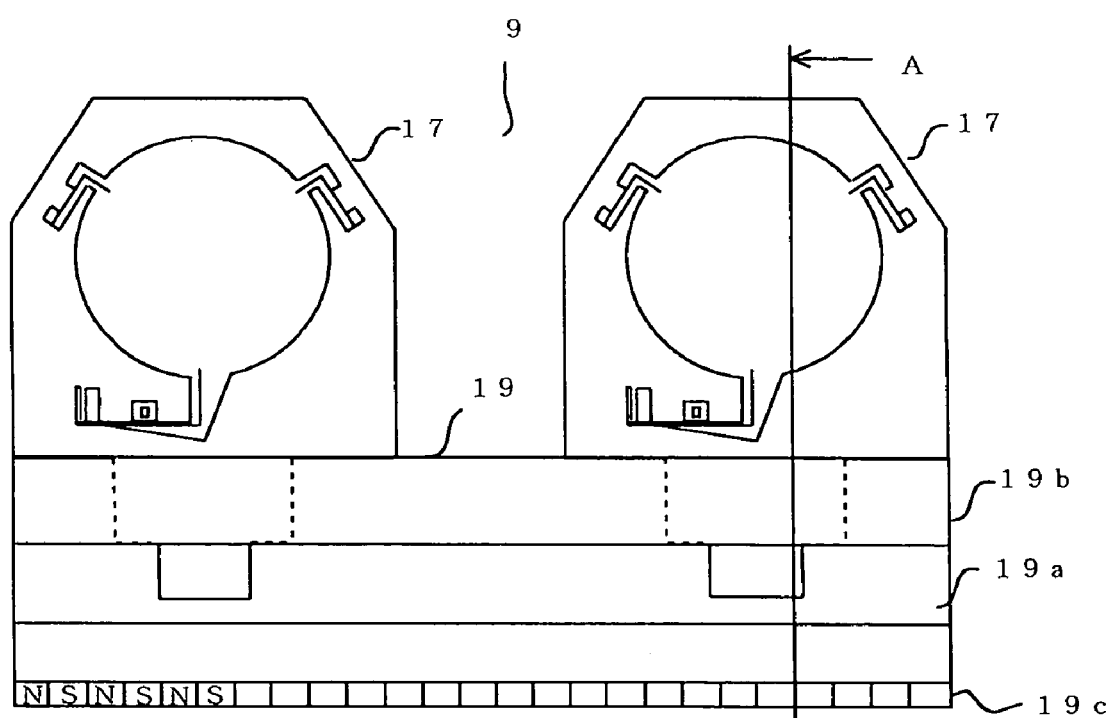
FIG. 4B is a front view showing a structure of a substrate holder carrier.

Subsequently, referring to FIG. 4, an example of the structure of the substrate holder will be described. FIG. 4A is a front view showing a structure of the substrate holder unit; FIG. 4B is a front view showing the structure of the substrate holder; and FIG. 4C is a cross-sectional view taken along the line A-A' in FIG. 4B.

As shown in FIG. 4A, the substrate holder unit 17 has a lower portion reduced in width in two steps and an upper portion of the substrate holder unit 17 formed with a circular opening 17a to which the substrate 8 is to be inserted. The outer peripheral surface of the substrate 8 is detachably gripped by a plurality of spring members 17b attached around the opening 17a.

As shown in FIG. 4B, the substrate holder 9 includes two substrate holder units 17 and a carrier 19 for retaining the substrate holder units 17, so that the carrier 19 moves on the path 6 and transports the substrate holder 17. The cross-section of the carrier 19 is, as shown in FIG. 4C, formed into an inverted angular C-shape having a recess 19a formed thereon, and an upper thick portion 19b has a slit-shaped groove to receive the substrate holder units 17 so as to be penetrated into the recess 19a. An intermediate portion 17c of the substrate holder unit 17 is fitted to the carrier 19, and the distal portion projects into the recess 19a so as to be capable of coming into contact with a bias application device for removal of accumulated film. A part to be brought into contact with the bias application device for removing the accumulated film maybe any part of the substrate holder unit 17.

As shown in FIG. 4B, carrier magnets 19c are provided along the lower edge of the carrier 19. The carrier magnet 19c is a rectangular parallelepiped small magnet, and a plural number of carrier magnets 19c are arranged at predetermined distances along the lower surface of the carrier 19 in the direction of travel. As shown in FIG. 4B, the carrier magnets 19c are provided so that S-poles and N-poles are arranged alternately.

Figure 5:
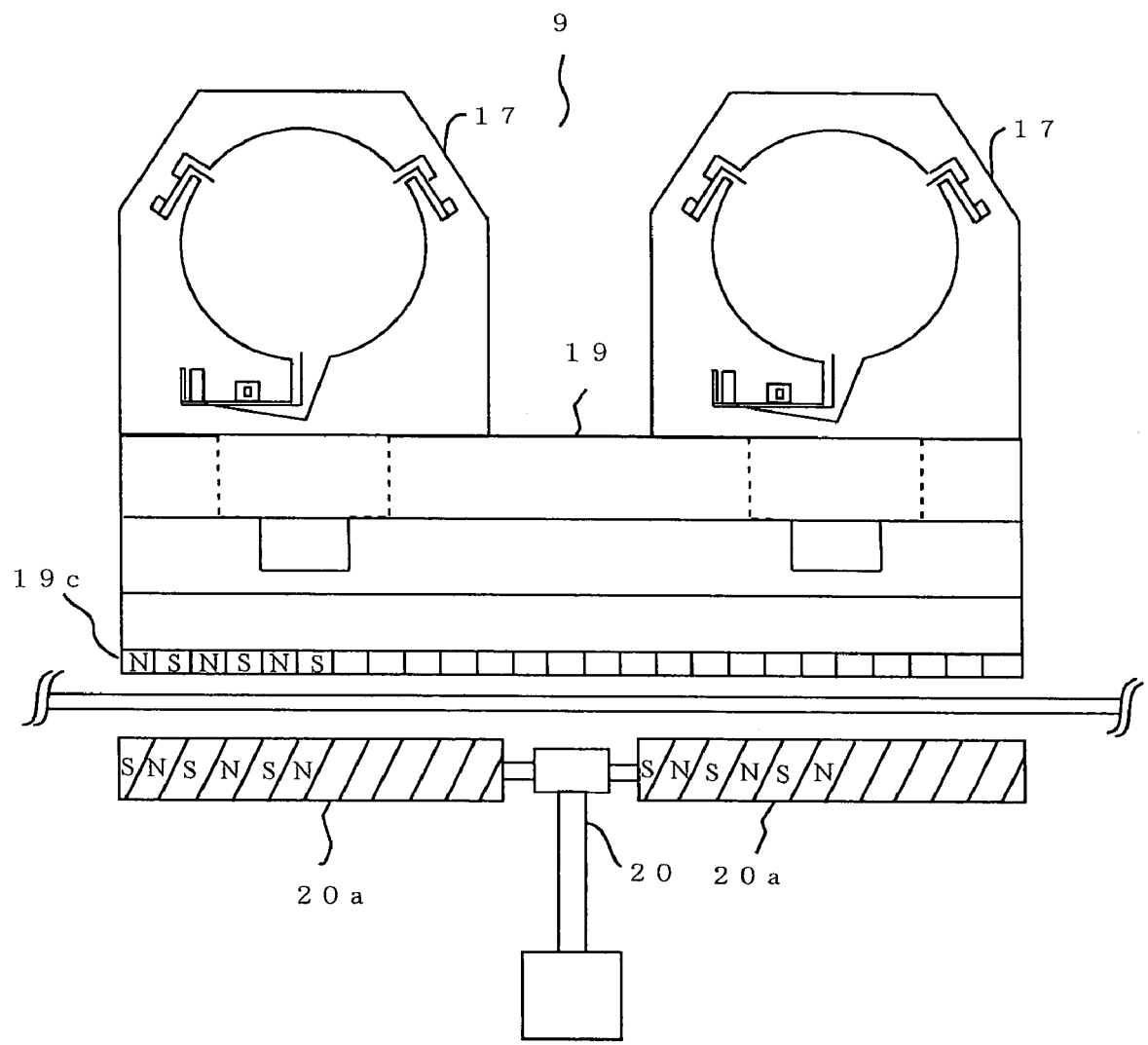
FIG. 5 is an explanatory drawing showing a transporting operation of the substrate holder carrier.

On the other hand, as shown in FIG. 5, a rotary magnetic mechanism 20 is provided on the side of the path 6, and transportation is performed by magnetic interaction between the carrier magnets 19c and a rotary magnet 20a. Since detailed description about the transporting mechanism and a method of transporting the substrate holders is disclosed in JP-A-8-274142, description will not be made in this specification.

Figure 6A:
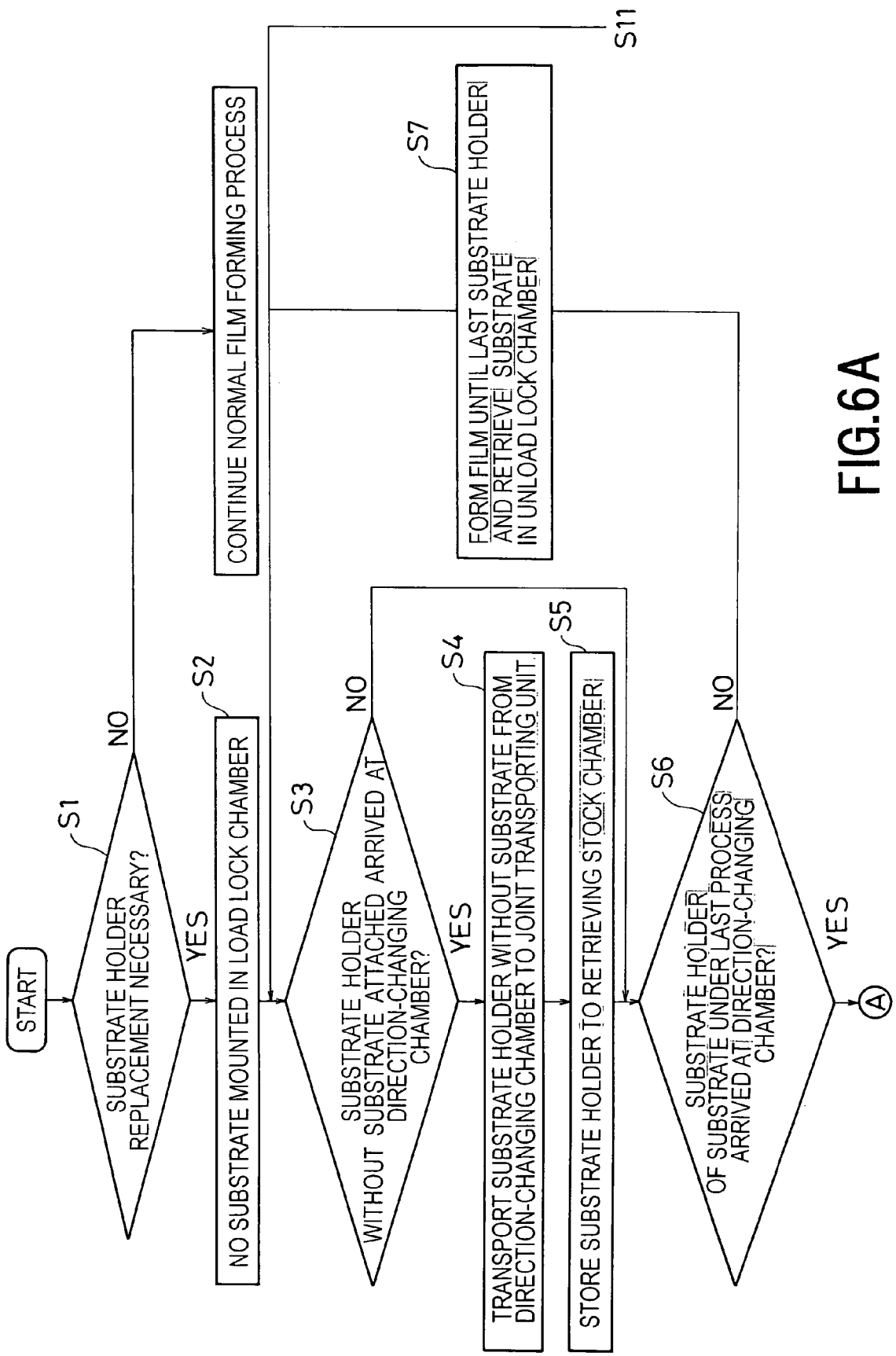
FIG. 6A and FIG. 6B are a flow chart showing a retrieving operation of used substrate holders and a feeding operation of new substrate holders by the stock chambers.
Figure 6B:
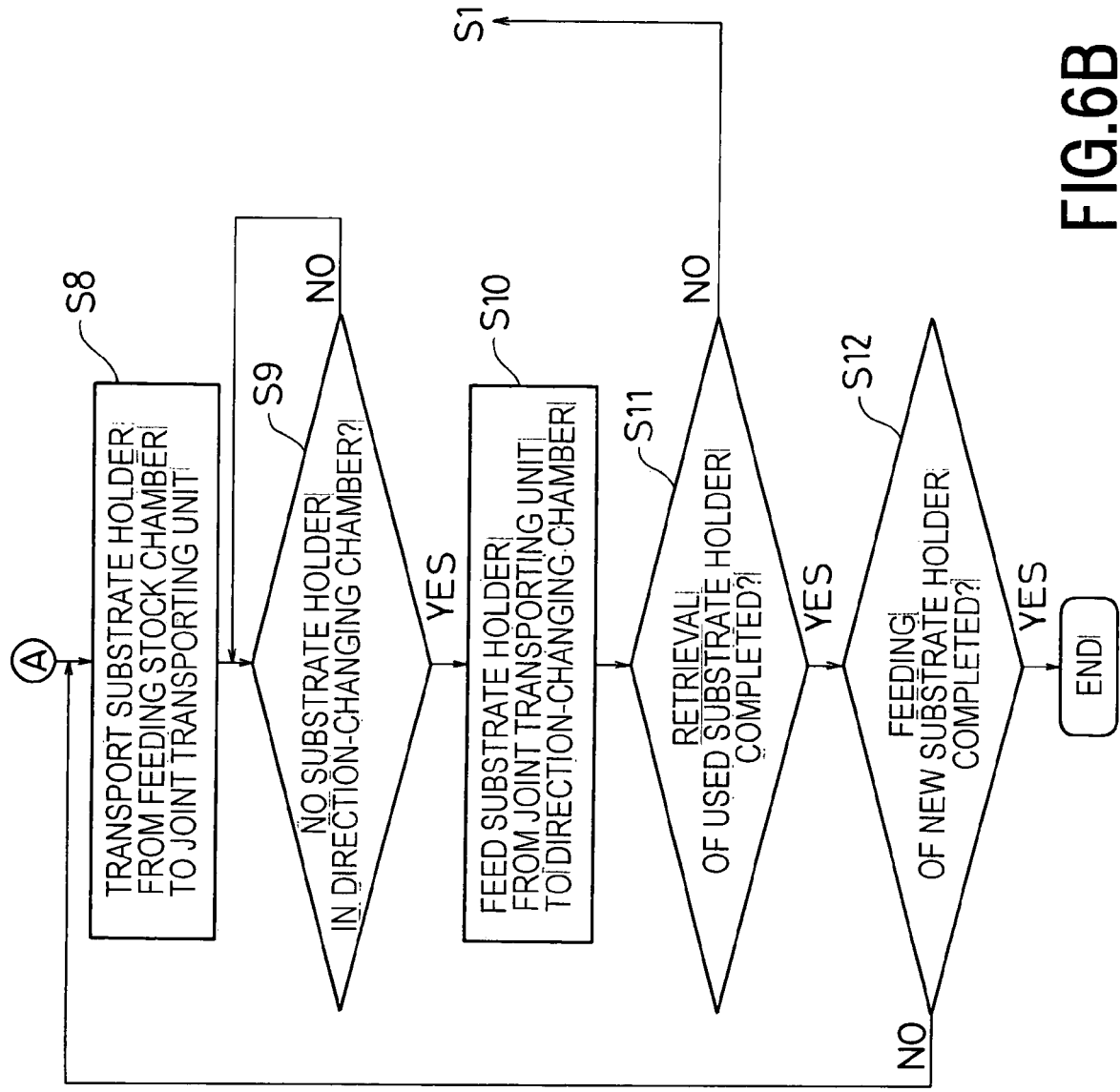
Figure 7:
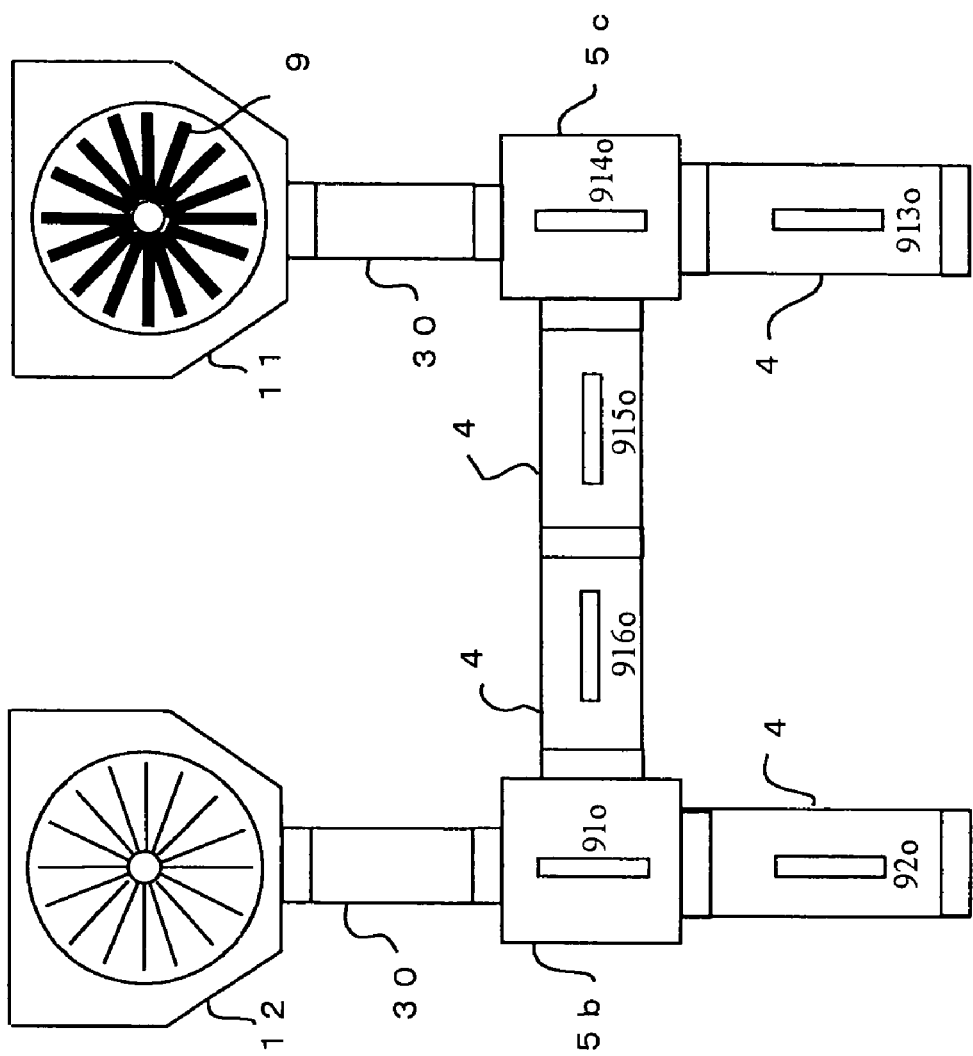
FIG. 7 is a drawing showing the positions of the substrate holder carrier on a path when storage of the substrate holders to the retrieving stock chamber is started.
Figure 8:
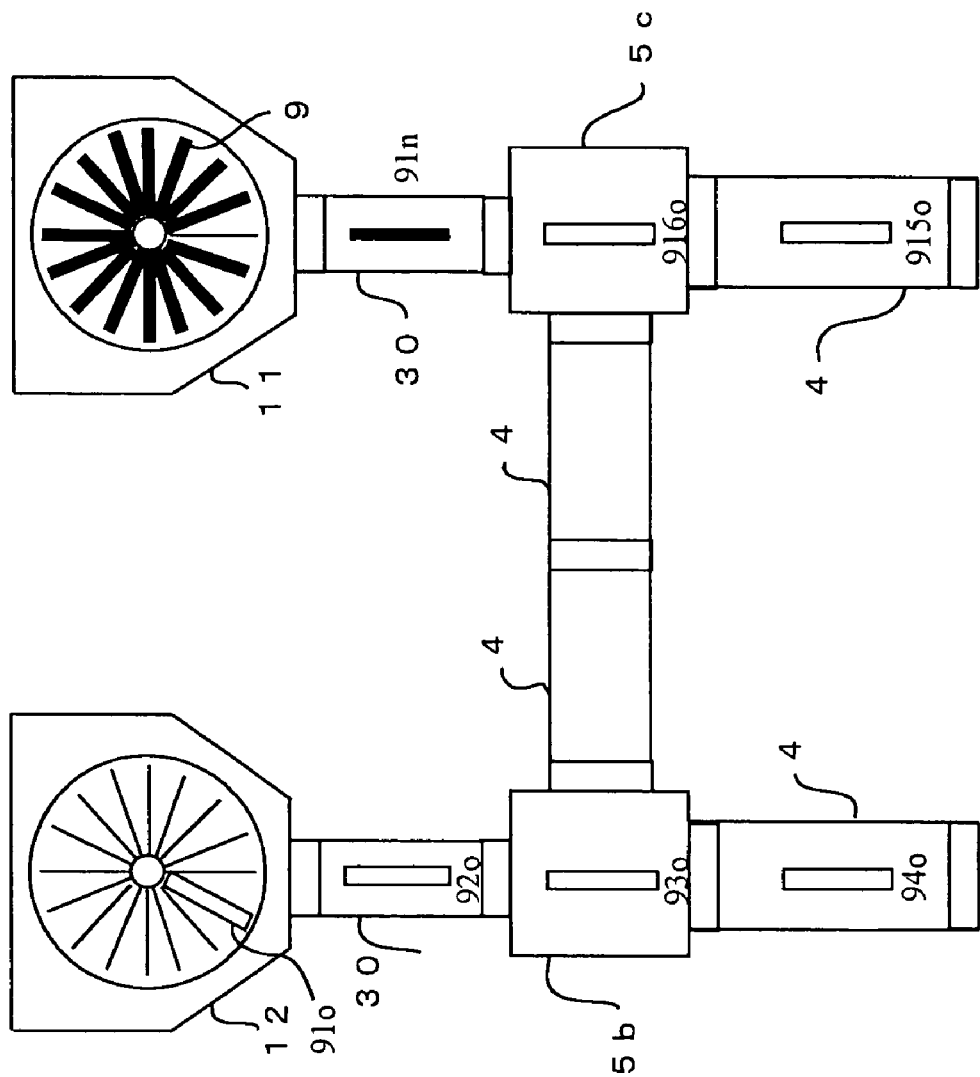
FIG. 8 is a drawing showing the position of the substrate holder carrier on the path when starting feeding of the substrate holders from a feeding stock chamber.

Referring now to FIG. 6 to FIG. 8, an example of the operation of the stock chamber will be described. FIG. 6 is a flowchart showing an operation to retrieve the total number of used substrate holders in the stock chamber, and an operation to feed new substrate holders; FIG. 7 is a drawing showing the positions of the substrate holders 9 in the path 6 when storage of the substrate holders 9 to the rotary retrieving stock chamber 12 is started, FIG. 8 is a drawing showing the positions of the substrate holders 9 on the path 6 when feeding of the substrate holders 9 from the rotary feeding stock chamber 11 is started. The film forming apparatus shown in FIG. 7 and FIG. 8 is provided with the rotary retrieving stock chamber 12 for retrieving the substrate holders 9 from the path 6 and the rotary feeding stock chamber 11 for feeding new substrate holders to the path 6, in which the stock chambers for feeding and retrieving the substrates 8 and part of the path 6 are shown. Substrate holders 91o to 916o shown in FIG. 7 and FIG. 8 are the substrate holders 9 which need to be replaced, and substrate holders 91n are new substrate holders 9. The operation of the stock chamber can be changed by the structure of the film forming apparatus or the film forming process.

The stock chambers are adapted to retrieve the total number of used substrate holders from the path and feed new substrate holders to the path, as well as to retrieve only defective substrate holders generated during film forming process, or new substrate holders having a problem in attachment or detachment after having being fed and feed new substrate holders to the path.

Retrieval of the substrate holders from, and feeding of the substrate holders to, the path by the stock chambers are performed in a state in which the substrates are not mounted to the substrate holders, or in a state in which the substrates are mounted to the substrate holders. When the substrates are not mounted to the substrate holders, after having retrieved the substrates formed with the film in the unload chamber, only the substrate holders are retrieved in the stock chamber for being replaced with new substrate holders or for having with the accumulated film removed in vacuo.

When the substrates are mounted to the substrate holders, the substrate holders are retrieved in the stock chamber together with the substrates after having formed with the film mounted thereon, and then replaced with new substrates, while the substrates having formed with the film are retrieved in atmospheric air. When there exist substrates with defective film formation, after having retrieved such substrates in a state of being mounted to the substrate holders into the stock chamber, they are replaced with new substrate holders, or the accumulated film on the retrieved substrate holders is removed in vacuo.

Control of the operation of the stock chamber shown below is performed by a computer built in a control unit of the substrate processing apparatus for information storage disks 1.

The substrate holders 9 on which cleaned new substrate holder units 17 are mounted are stored in the feeding stock chamber 11 in advance, and the substrate holders 9 stored in the rotary retrieving stock chamber 12 are removed so that the coming substrate holders 9 can be stored.

The control unit of the substrate processing apparatus for information storage disks 1 checks whether or not replacement of the substrate holders 9 are necessary (Step S1). Necessity of replacement of the substrate holders 9 is determined based on the quality of the products, used hours of the substrate holders, the amount of production of substrates, instruction of replacement from the operator, and so on. When it is not necessary to replace the substrate holders, the normal film forming process on the substrates 8 is continued. When it is necessary to replace the substrate holders, attachment of the unprocessed substrates 8 to the substrate holders 9 arriving at the load lock chamber 2 is avoided (Step S2). Then, the substrate holders 9 having no substrates 8 attached thereon are fed to the first direction-changing chamber 5a. From then on, the load lock chamber 2 does not mount the unprocessed substrates 8 until new substrate holders 9 arrive. The respective vacuum chambers 4 do not perform processing when the substrate holders 9 having no substrates 8 attached thereon arrives and allow them to pass through. Then, whether or not the substrate holders 9 without having the substrates arrive at the second direction-changing chamber 5b is checked (Step S3). When the substrates 8 are mounted to the substrate holders 9, the substrate holders 9 are rotated by 90 degrees by the direction-changing mechanism provided in the direction-changing chamber 5 and the procedure goes to Step S6. As shown in FIG. 7, when the substrate holder carrier without substrates (91o in FIG. 7) arrives at the second direction-changing chamber 5b, the substrate holders 9 without substrates are transported from the second direction-changing chamber 5b to the joint transporting unit 30 (Step S4), and then the substrate holders 9 are transported from the joint transporting unit 30 to the rotary retrieving stock chamber 12 (Step S5). The rotary retrieving stock chamber 12 rotates the rotary table 11a by a predetermined angle after having stored the substrate holder 9 for preparing for storage of a subsequent substrate holder 9.

Then, as shown in FIG. 8, whether or not the substrate holder 916o of the substrate 8 under the last film forming process arrives at the third direction-changing chamber 5c is checked (Step S6). If the substrate holder 916o of the substrate 8 under the last film forming process does not arrive at the third direction-changing chamber 5c, film forming process is performed until film formation on the last substrate holder to be retrieved is completed, and the substrate 8 formed with the film is retrieved in the unload lock chamber (Step S7). The substrate holders 9 are transported and then the procedure goes to Step S3. As shown in FIG. 8, when the substrate holder 916o of the substrate 8 under the last film forming process arrives at the third direction-changing chamber 5c, new substrate holders 91n are transported from the rotary feeding stock chamber 11 to the joint transporting unit 30 (Step S8). Also, the rotary feeding stock chamber 11 transports the substrate holders 9 to the joint transporting unit 30, and then rotates the rotary table 11a by a predetermined angle for preparing for feeding of a subsequent substrate holder 9. Whether or not the substrate holders 9 are not in the third direction-changing chamber 5c is checked (Step S9), and when the substrate holder 9 is not in the third direction-changing chamber 5c, new substrate holders 91n are fed from the joint transporting unit 30 to the third direction-changing chamber 5c (Step S10).

Subsequently, whether or not all the used substrate holders 9 are retrieved in the rotary retrieving stock chamber 12 is checked (Step S11). When the used substrate holders 9 are in the substrate processing apparatus for information storage disks 1, the procedure goes to Step S3. Then, whether or not all new substrate holders 9 are completely fed from the rotary feeding stock chamber 11 to the substrate processing apparatus for information storage disks 1 is checked (Step S12), and if there are substrate holders 9 which are not fed yet, the procedure goes to Step S8.

With the process described above, all the used substrate holders 9 in the substrate processing apparatus for information storage disks 1 can be replaced with the new substrate holders 9 in a short time. In the case where new substrate holders having a problem in attachment and detachment are detected after completion of feeding of all the new substrate holders by checking of attachment and detachment of the substrate performed in the load lock chamber, they are replaced with spare new substrate holders according to the procedure in the flowchart of the operation for retrieving specific substrate holders, described later, and the operation for feeding new substrate holders after having retrieved the specific substrate holder.

Since the stock chamber is provided with an accumulated film removing mechanism and hence the accumulated film on the substrate holder can be removed without exposing the substrate holder to atmospheric air, re-evacuation from the atmospheric pressure is not necessary, whereby productivity is improved.

Figure 9A:
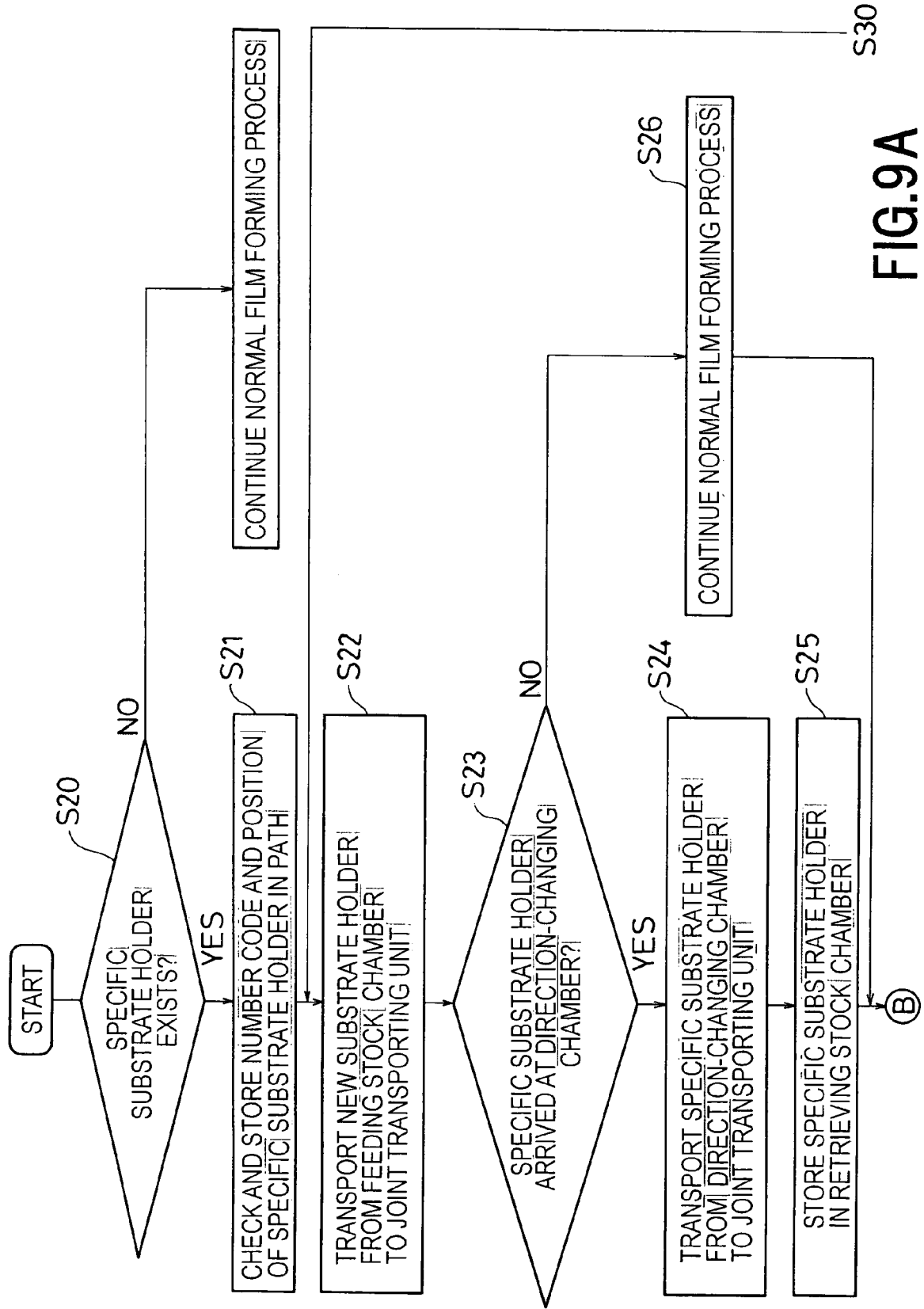
FIG. 9A and FIG. 9B are a flowchart showing the retrieving operation of the specific substrate holders and the feeding operation of new substrate holders of the stock chamber after the retrieving operation.
Figure 9B:
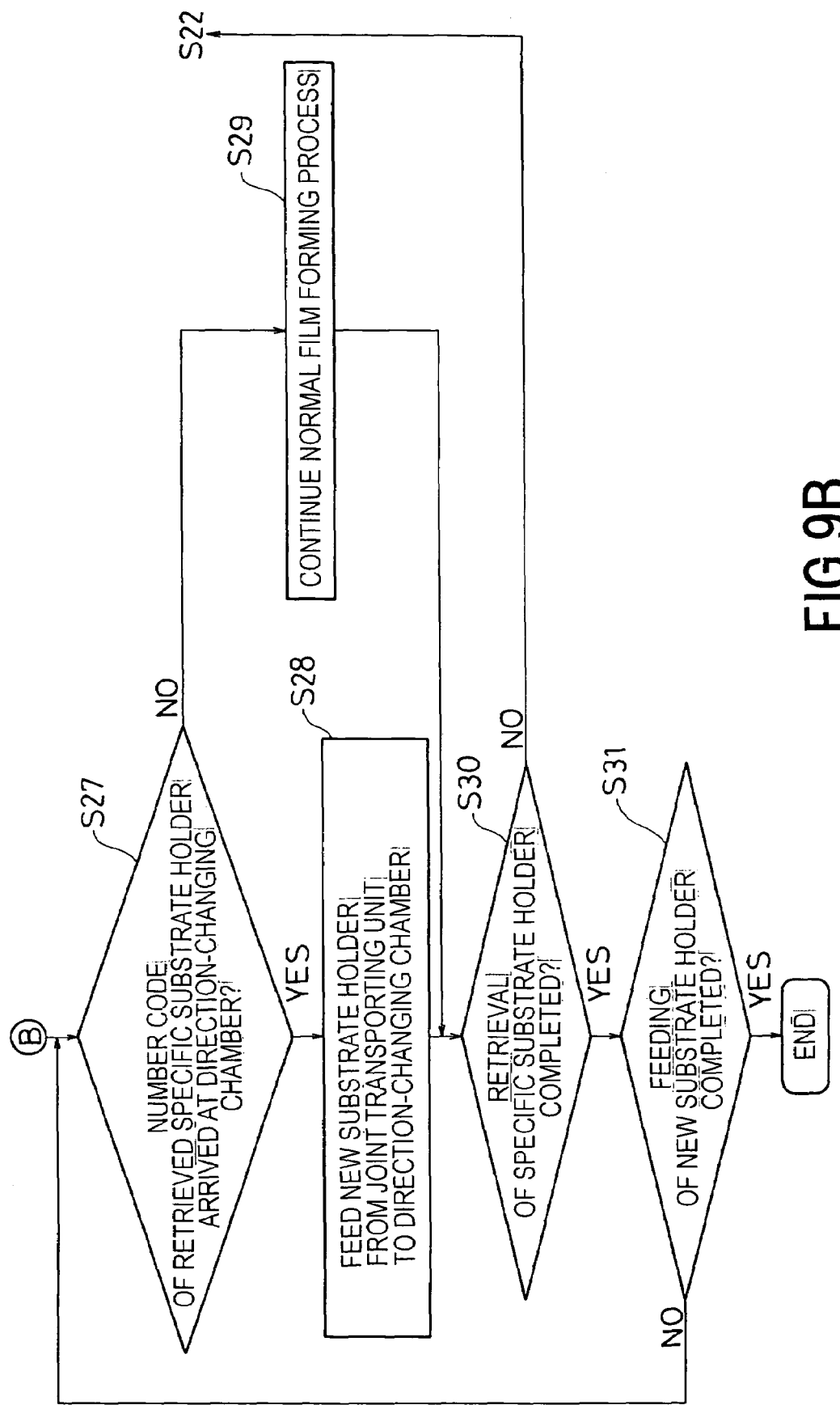

FIG. 9 is a flowchart showing the operation of retrieving the specific substrate holder in the stock chamber and the operation of feeding a new substrate holder after having retrieved the specific substrate holder. The specific substrate holder represents a defective substrate holder generated during any of the processes relating to film formation, or a substrate holder which is detected to have a problem by attachment and detachment checking procedure, which needs to be retrieved from the path.

In the first place, cleaned and new substrate holders 9 are stored in the feeding stock chamber in advance, and the retrieving stock chamber is provided with storing spaces by a number larger than the number of the required substrate holders in advance so that the substrate holders 9 can be stored. When the spaces more than that described above are necessary, the stored substrate holders 9 are removed in advance.

The control unit of the substrate processing apparatus for information storage disks 1 always controls the number codes of the substrate holders and the positions thereof on the path, and checks whether or not the specific substrate holder exists on the path (Step S20). When the specific substrate holder does not exist on the path, that is, when replacement of the substrate holder is not necessary, the normal film forming process on the substrate 8 is continued. When the specific substrate holder exists on the path, the number code of the specific substrate holder and the position thereof on the path are checked and the number code and the position are stored. Thereafter, the number code and the position of the specific substrate holder on the path are controlled by the control unit. Subsequently, a new substrate holder 9 is transported from the rotary feeding stock chamber 11 to the joint transporting unit 30 (Step S22). Also, the rotary feeding stock chamber 11 rotates the rotary table 11a by a predetermined angle after having transported the substrate holder 9 to the joint transporting unit 30 for preparing for feeding of a subsequent substrate holder 9. When the specific substrate holder 9 arrives, the respective vacuum chambers 4 do not perform processing and allow the substrate holder 9 to pass through.

Subsequently, whether or not the specific substrate holder 9 arrives at the second direction-changing chamber 5b is checked (Step S23). If the specific substrate holder 9 does not arrive at the second direction-changing chamber 5b, the substrate holder 9 is rotated by 90 degrees by the direction-changing mechanism provided in the direction-changing chamber 5, then the normal film forming process is continued (Step S26), and then the procedure goes to Step S27. When the specific substrate holder arrives at the second direction-changing chamber 5b, the specific substrate holder 9 is transported from the second direction-changing chamber 5b to the joint transporting unit 30 (Step S24), and the specific substrate holder 9 is transported from the joint transporting unit 30 to the rotary retrieving stock chamber 12 for storage (Step S25). The rotary retrieving stock chamber 12 stores the substrate holder 9, and then rotates the rotary table 11a by a predetermined angle for preparing for storage of a subsequent specific substrate holder 9.

Then, whether or not the number code of the retrieved specific substrate holder arrives at the third direction-changing chamber 5c (Step S27) is checked. The number code of the retrieved specific substrate holder does not arrive at the third direction-changing chamber 5c, the normal film forming process is continued (Step S29), and the procedure goes to Step S30. When the number code of the retrieved specific substrate holder arrives at the third direction-changing chamber 5c, a new substrate holder 9 is fed from the joint transporting unit 30 to the third direction-changing chamber 5c (Step S28).

Subsequently, whether or not the rotary retrieving stock chamber 12 has retrieved the specific substrate holder 9 is checked (Step S30). When the specific substrate holder 9 exists in the substrate processing apparatus for information storage disks 1, the procedure goes to Step S22. Whether or not the rotary feeding stock chamber 11 has fed a new substrate holder 9 to the substrate processing apparatus for information storage disks 1 is checked (Step S31), and if a substrate holder 9 which is not yet fed exists, the procedure goes to Step S27.

With the operation described above, the specific substrate holder on the path is retrieved in the retrieving stock chamber, and a new substrate holder is fed from the feeding stock chamber to the path at the position of the number code of the specific substrate holder.

Figure 10:
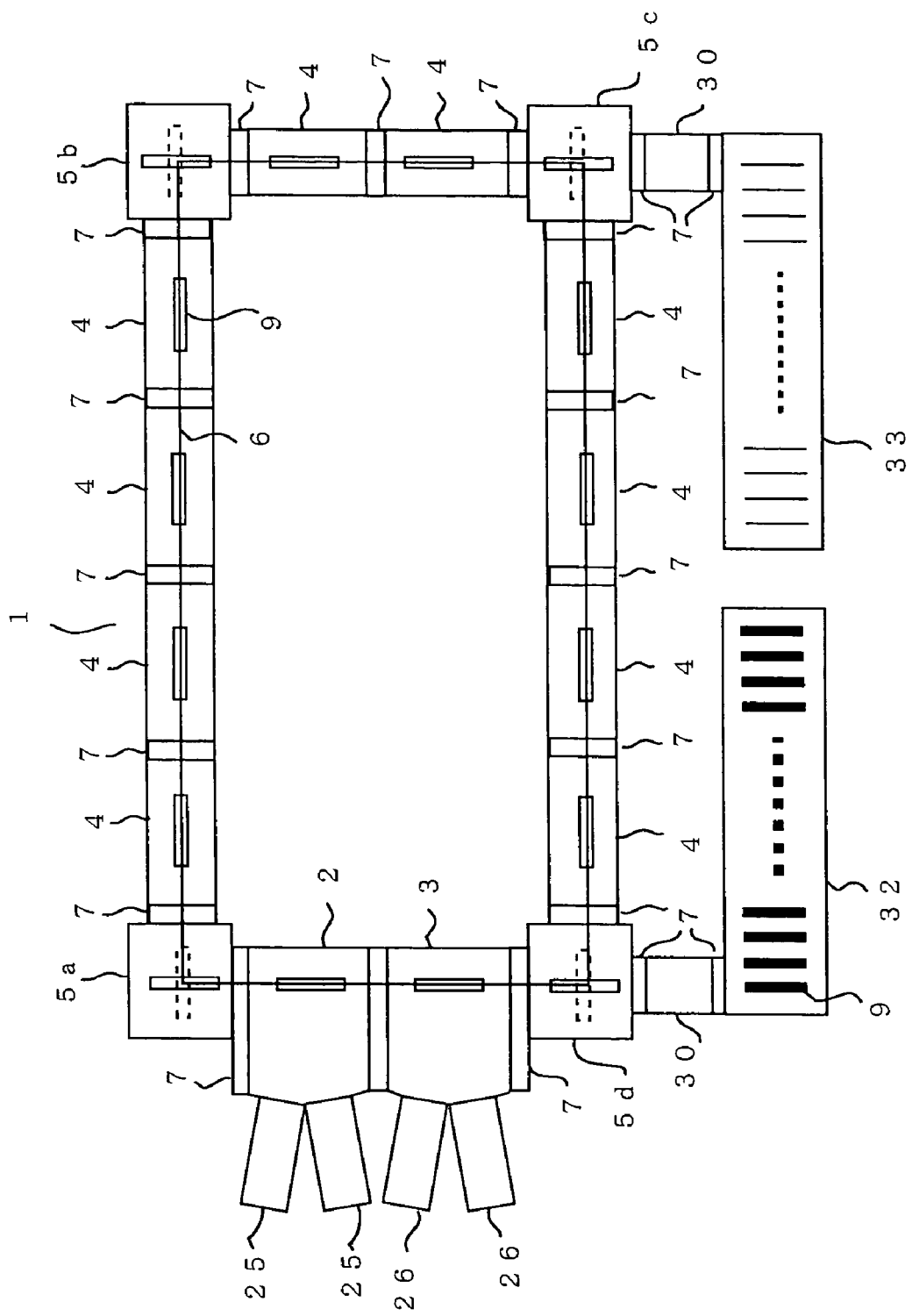
FIG. 10 is a drawing showing a schematic structure of a substrate processing apparatus for information storage disks as the film forming apparatus to which a slide-type feeding stock chamber and a slid-type retrieving stock chamber are connected.
Figure 11:
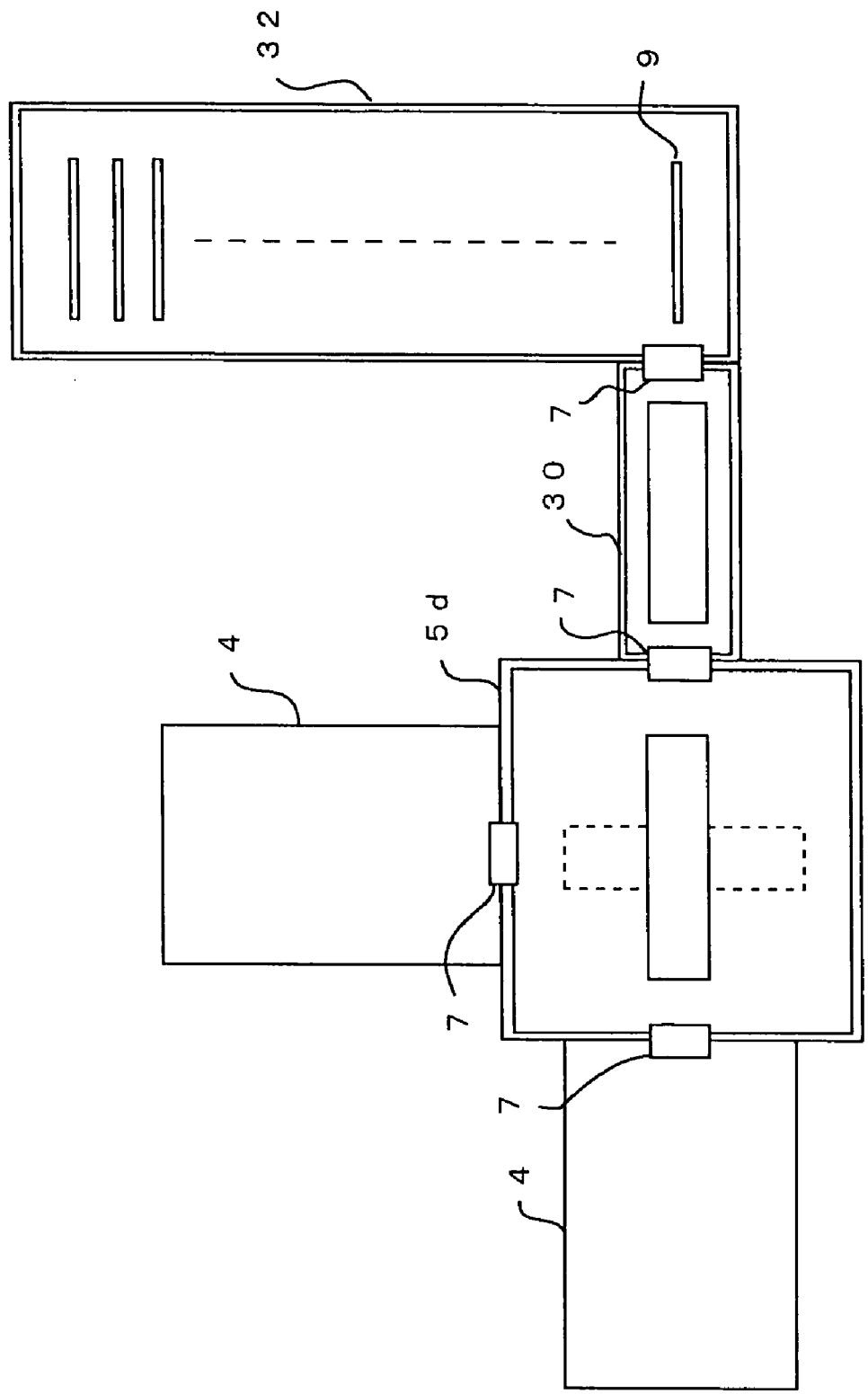
FIG. 11 is a schematic drawing in which the slide-type feeding stock chamber is connected to the direction-changing chamber.
Figure 12:
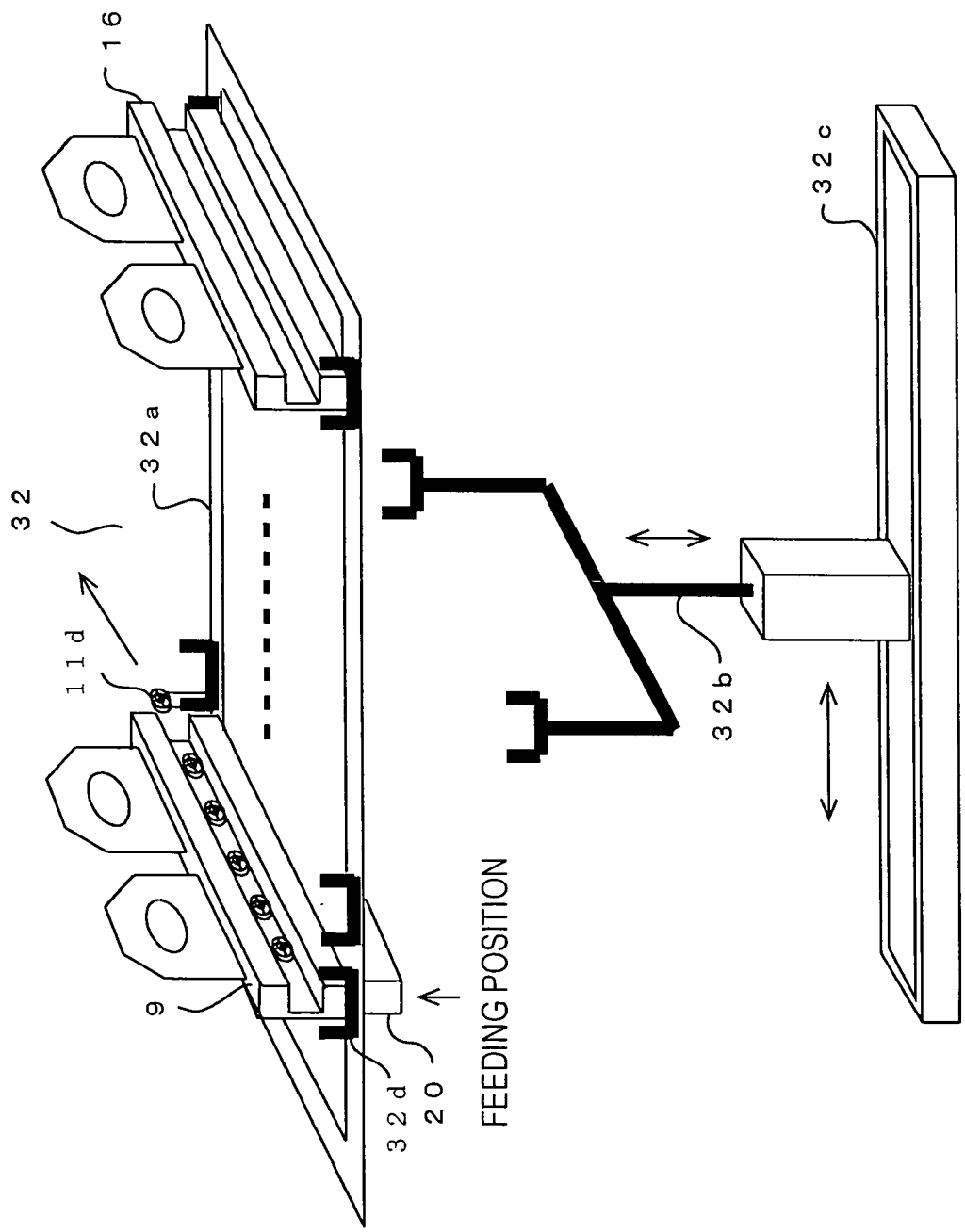
FIG. 12 is an explanatory drawing showing the operation of the slide-type feeding stock chamber.

Referring now to FIG. 10 to FIG. 12, a slide-type feeding stock chamber 32 and a slide-type retrieving stock chamber 33 will be described. As shown in FIG. 10, the slide-type feeding stock chamber 32 supplies stored new substrate holders 9 to the path 6. The slide-type retrieving stock chamber collects and stores the used substrate holders 9 from the path 6. The load lock chamber 2 for mounting the substrates 8 on which the films are not yet formed to the substrate holders 9, the unload lock chamber 3 for retrieving the substrates 8 formed with films from the substrate holders 9, the vacuum chamber 4 for performing various processes, the direction-changing chambers 5 having the direction-changing mechanism for turning the direction of transportation of the substrates 8 by 90 degrees, and the path 6 through which the substrate holders 9 holding the substrates 8 along the respective vacuum chambers 4 shown in FIG. 10 have the same structures and the same functions as the substrate processing apparatus for information storage disks 1 shown in FIG. 1, and hence the description will not be made again.

As shown in FIG. 11, the slide-type feeding stock chamber 32 is connected to the joint transporting unit via the gate valve 7, so as to be connected to the direction-changing chamber 5 (5d) from the joint transporting unit 30 through the gate valve 7. Although the stock chamber and the joint transporting unit 30 are configured to be separate chambers via the gate valve 7, a stock chamber having a gate valve on the side of the film forming apparatus and being provided with a path in the interior of the stock chamber in communication may also be applicable. Alternately, a stock chamber having a gate valve on the side of the stock chamber and being provided with a path outside the path of the film forming apparatus in communication may also be applicable.

The slide-type feeding stock chamber 32 includes the substrate holders 9 stored therein, and the substrate holders 9 are disposed at a predetermined pitch with the respective surfaces of the substrate holders 9 vertically in parallel with each other.

AS shown in FIG. 12, in the slid-type feeding stock chamber 32, the substrate holders 9 are mounted in parallel by a retaining fixtures 32d provided on the frame-shaped substrate holder retaining member 32a. There is also provided a pushup member 32b for pushing the substrate holders 9 on the substrate holder retaining member 32a from below. The pushup member 32b is capable of moving vertical in a space provided in the substrate holder retaining member 32a as shown in FIG. 12, and is configured to retain both ends of the substrate holders 9 with U-shaped attachments. The pushup member 32b is mounted to a slide carrier 32c. The slide carrier 32c is capable of linear movement along the substrate holder retaining member 32a, and is controlled so as to move to predetermined positions. Also, the rotary magnet 20 and the rotary mechanism 21 for transporting the substrate holders 9 from the feeding guide 11d of the slid-type feeding stock chamber 32 to the joint transporting unit 30 are provided.

With the provision of the pushup member 32b and slide carrier 32c, the substrate holders 9 are moved to a second path of the joint transporting unit 30. The substrate holder 9 moves to the direction-changing chamber 5 by the magnetic interaction between the rotary magnet mechanism 20 provided in the second path and the carrier magnet 19c under the substrate holder.

As shown in FIG. 10, the slide-type retrieving stock chamber 33 has the same structure as the slide-type feeding stock chamber 32, and is adapted to store the substrate holders 9 from the joint transporting unit 30 in sequence.

The slide-type feeding stock chamber 32 and the slide-type retrieving stock chamber 33 are provided with the accumulated film removing mechanisms provided therein so that the accumulated films on the surfaces of the substrate holders can be removed without exposing in atmospheric air. Therefore, re-evacuation from the atmospheric pressure is not necessary and the productivity is improved.

Since the operation of the stock chamber shown in FIG. 6 to FIG. 8 can be applied to the operations of the slide-type feeding stock chamber 32 and the slide-type retrieving stock chamber 33, detailed description will not be made.

The stock chambers described thus far are based on the embodiment in which the feeding stock chamber and the retrieving stock chamber are connected respectively to the direction-changing chambers via the joint transporting unit, the following example may be applicable to the film forming apparatus according to the invention.

Figure 13:
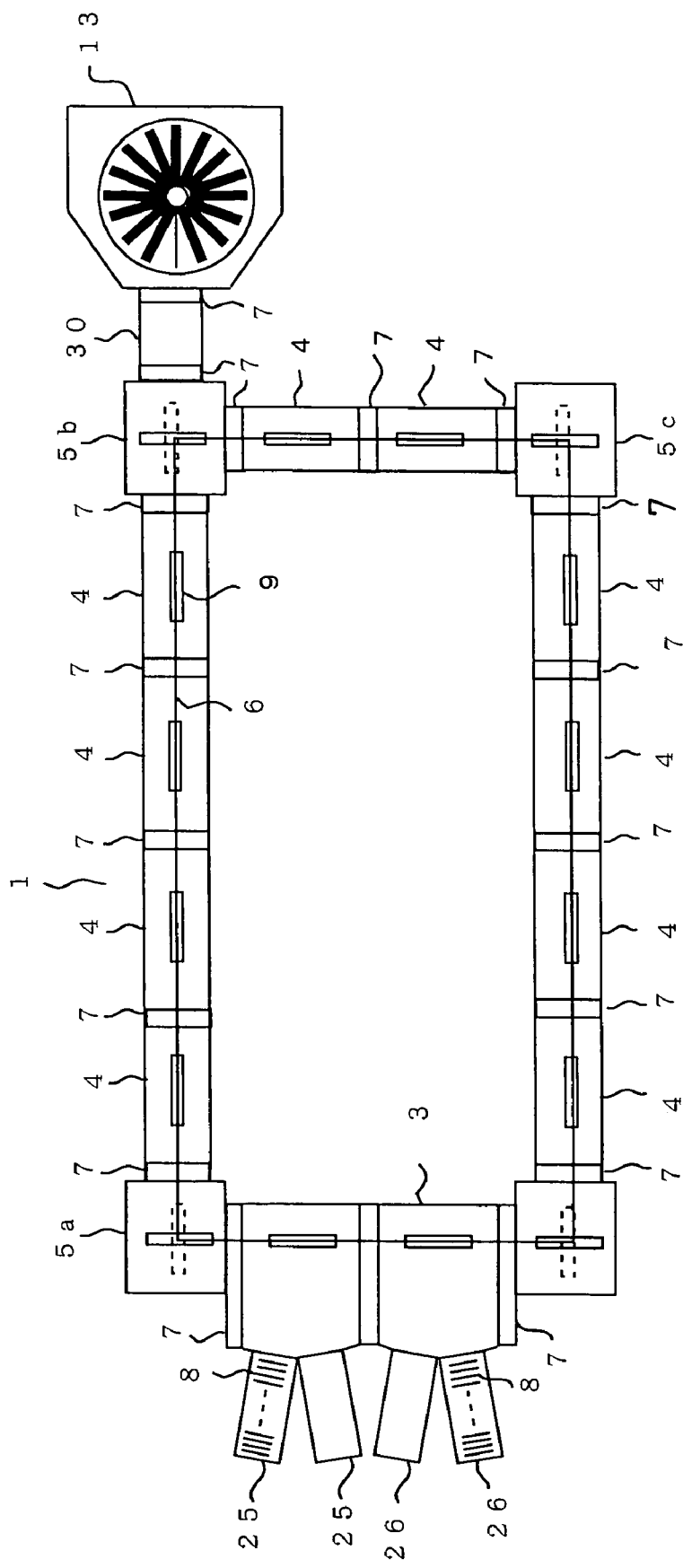
FIG. 13 is a drawing showing a state in which a rotary retrieving and feeding stock chamber, which can retrieve and feed the substrate holder carriers simultaneously, is connected to the path.

FIG. 13 shows an example in which a rotary retrieving and feeding stock chamber 13 having the substrate holders and being capable of retrieving and feeding the substrate holders 9 simultaneously is connected to the path 6.

As shown in FIG. 13, the rotary retrieving and feeding stock chamber 13 for performing retrieving and feeding the substrate holder 9 is connected to the direction-changing chamber 5b, which first retrieves the used substrate holders 9 from the path 6 and stores them in the rotary retrieving and feeding stock chamber 13. Subsequently, the stored cleaned substrate holder 9 is rotated to the feeding position, where it is fed to the joint transporting unit 30. Then, the used substrate holder 9 from the path 6 is stored to the position where the cleaned substrate holder 9 used to be and now is vacant. In this manner, retrieval of the substrate holders 9 from the path 6 and feeding of the substrate holders 9 to the path 6 are performed by a single stock chamber.

Figure 14:
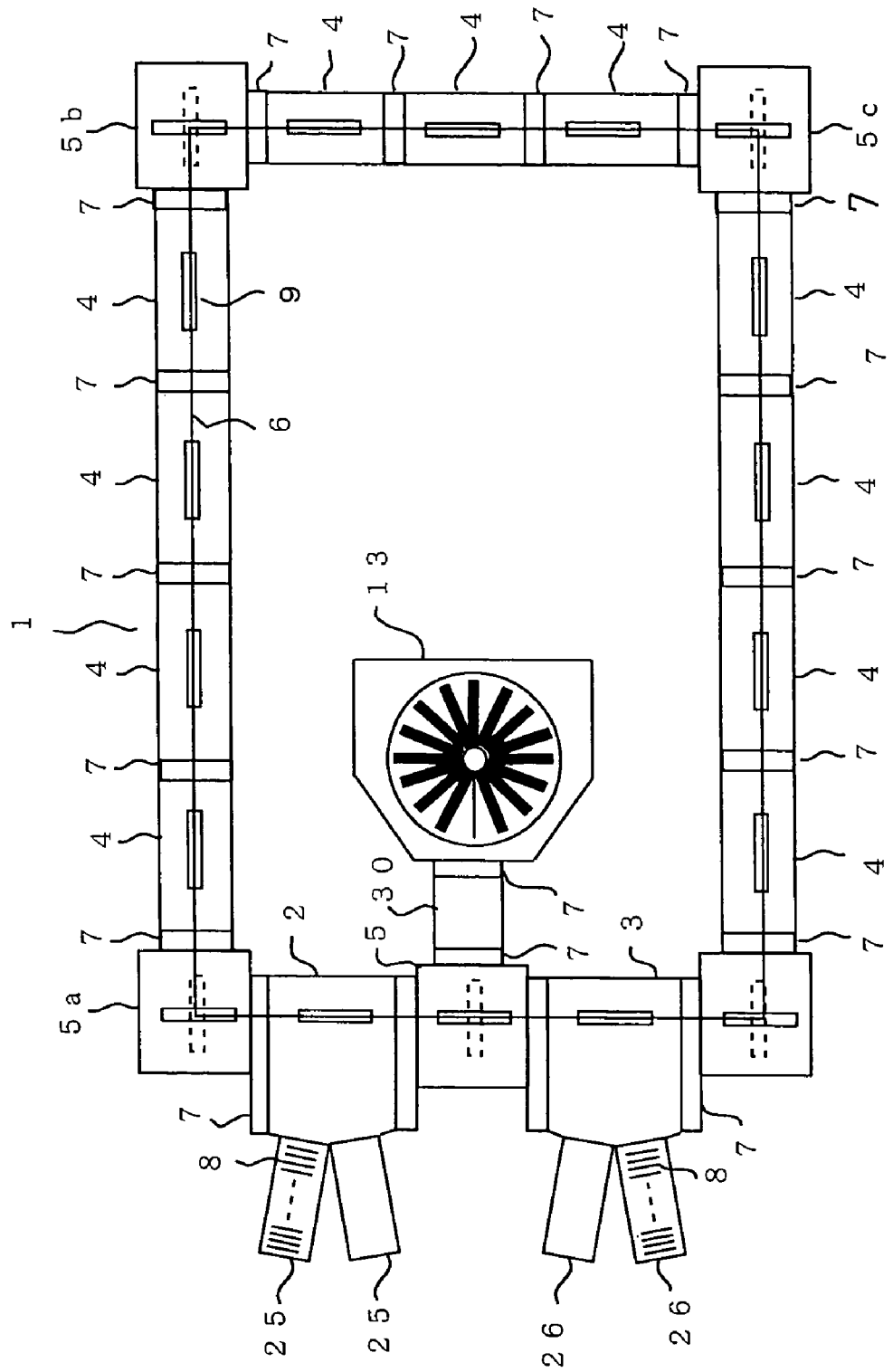
FIG. 14 is a drawing showing a state in which the rotary retrieving and feeding stock chamber is connected to a direction-changing chamber between an unload lock chamber and a load lock chamber.

As shown in FIG. 14, the direction-changing chamber 5 is provided between the unload lock chamber 3 and the load lock chamber 2, so that the rotary retrieving and feeding stock chamber 13 is connected to the direction-changing chamber 5 between the unload lock chamber 3 and the load lock chamber 2. By the provision of the rotary retrieving and feeding stock chamber 13 between the unload lock chamber 3 and the load lock chamber 2, the substrate holder 9 from which the substrate 8 is removed in the unload lock chamber 3 is transported to the subsequent direction-changing chamber 5, and at the same position, the used substrate holder 9 is retrieved by the rotary retrieving and feeding stock chamber 13. Therefore, the substrate holder 9 is no longer necessary to move within the vacuum chamber 4. Also, since a cleaned new substrate holder 9 fed from the rotary retrieving and feeding stock chamber 13 is fed from the direction-changing chamber to the load lock chamber 2, it is no longer necessary to move within the vacuum chamber 4, whereby the transporting time of the substrate holder 9 is reduced and the time required for replacement of the substrate holder 9 may be reduced.

Figure 15:
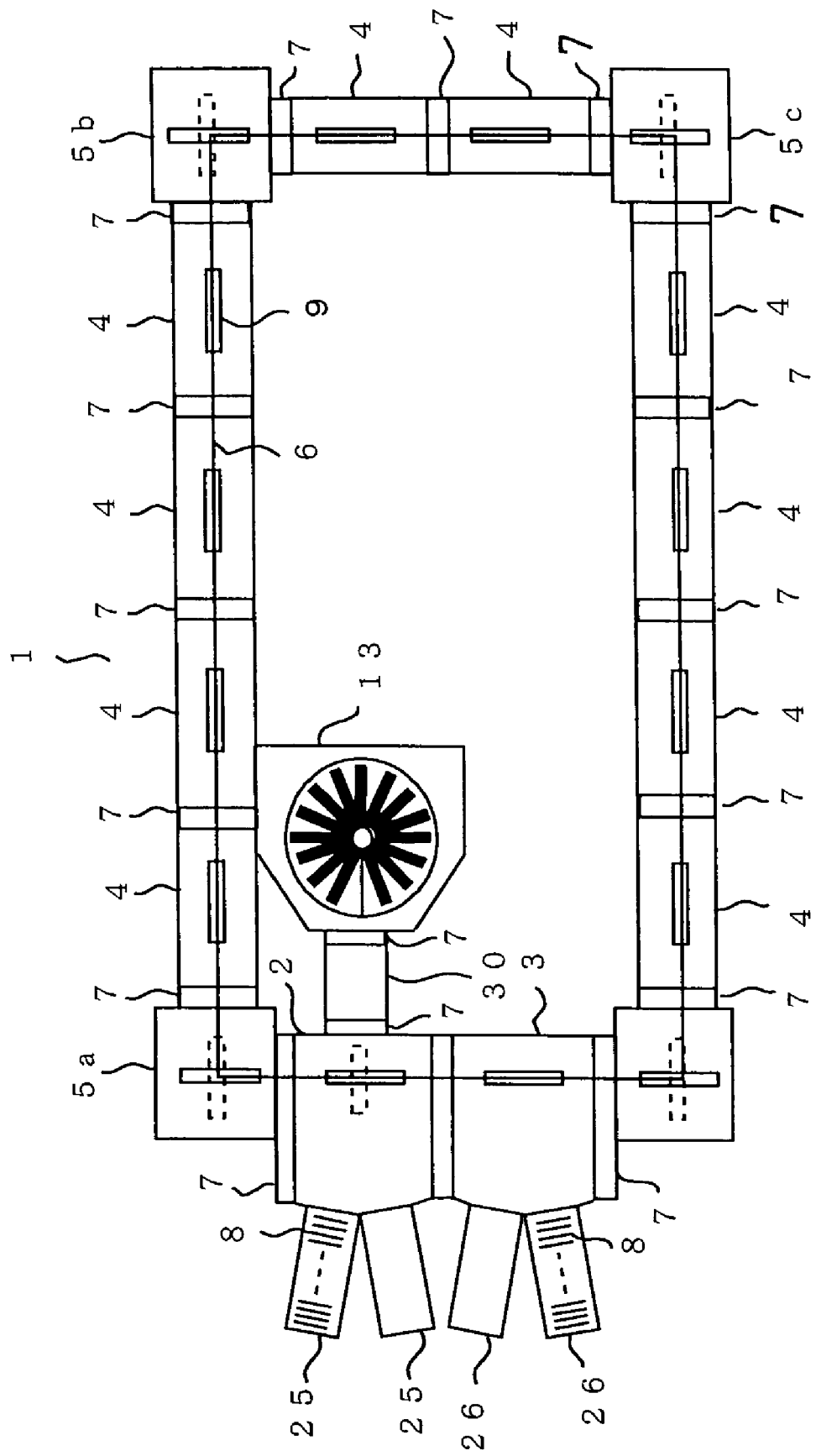
FIG. 15 is a drawing showing a state in which the rotary retrieving and feeding stock chamber is connected to the load lock chamber.

As shown in FIG. 15, it is also possible to connect the rotary retrieval and feeding stock chamber 13 to the load lock chamber 2 and provide the load lock chamber 2 with a direction-changing function for turning the substrate holder 9 by 90 degrees to perform retrieving and feeding of the substrate holder 9.

Although the rotary retrieving and feeding stock chamber 13 is connected to the load lock chamber 2 in the example shown in FIG. 15, it is also possible to connect the rotary retrieving and feeding stock chamber 13 to the unload lock chamber 3.

Figure 16:
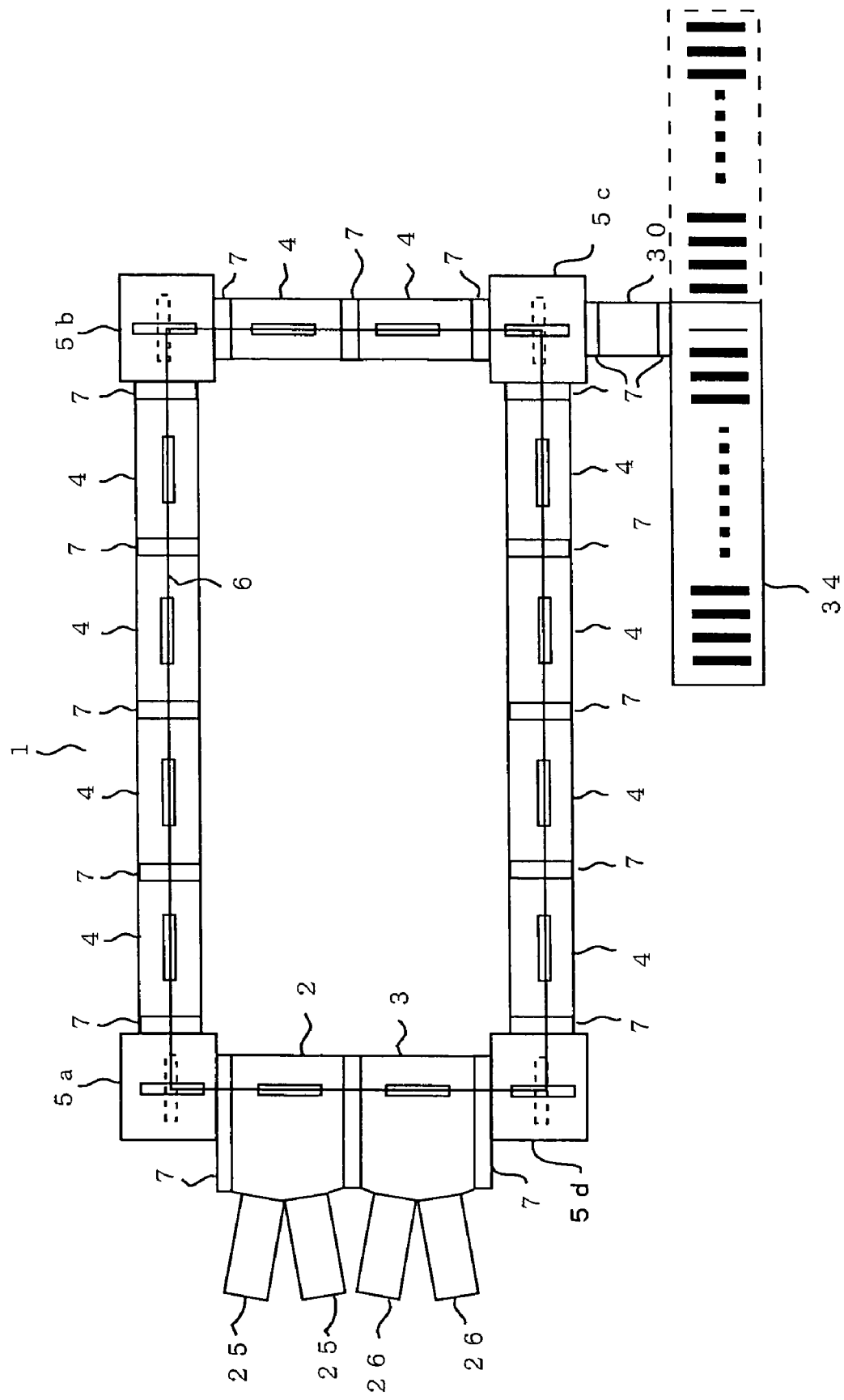
FIG. 16 is a drawing showing a state in which the slide-type retrieving and feeding stock chamber, in which an entire substrate holder retaining member shown in FIG. 8 is configured to be movable, is connected.

Alternatively, as shown in FIG. 16, with a slide-type retrieving and feeding stock chamber 34 in which the entire substrate holder retaining member 32a shown in FIG. 12 is configured to be movable, retrieval and feeding of the substrate holder 9 from/to the path 6 can be performed. The slide-type retrieving and feeding stock chamber 34 shown in FIG. 16 can move the substrate holder retaining member 32a to the position shown by a broken line.

Figure 17:
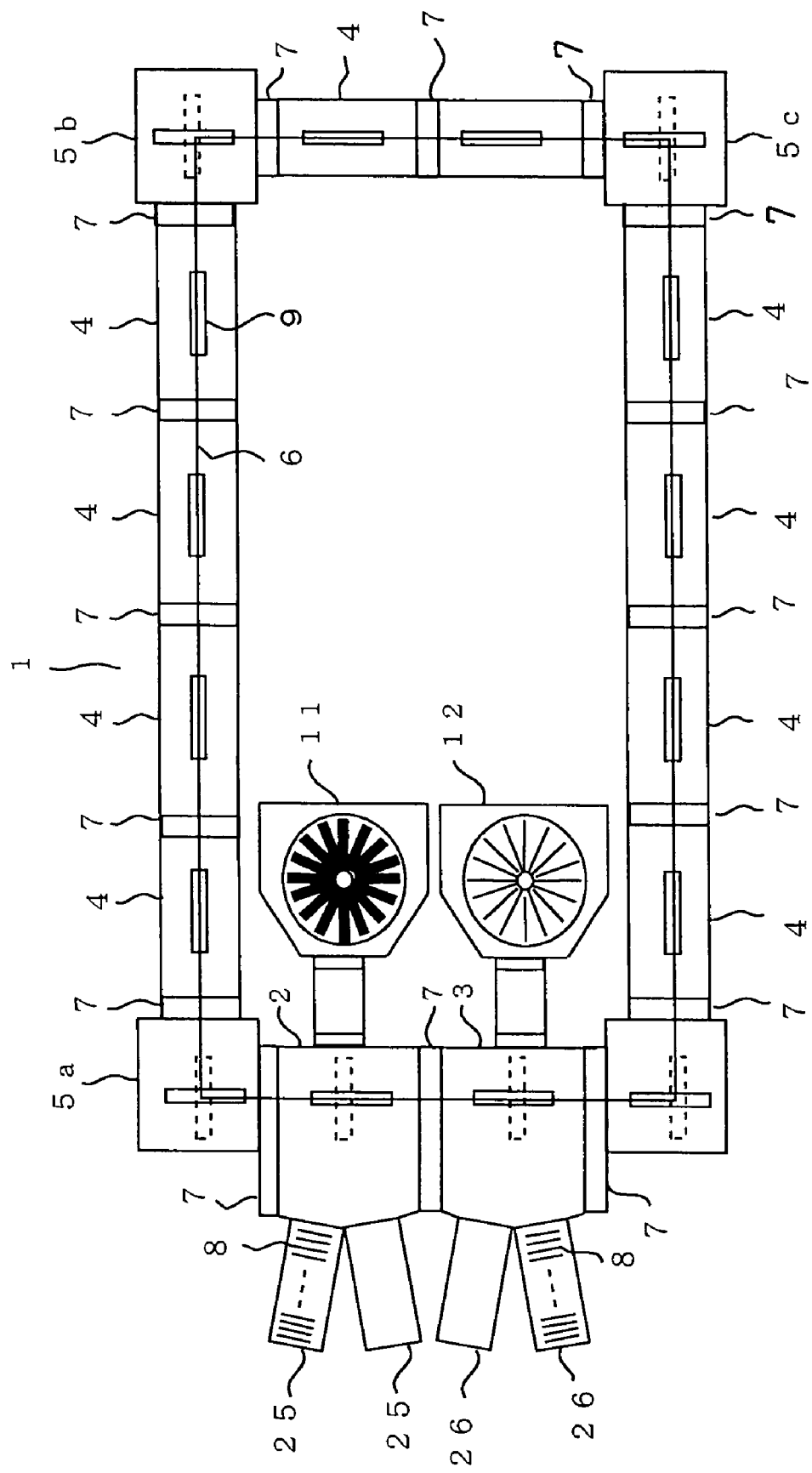
FIG. 17 is a drawing showing a state in which the rotary feeding stock chamber is connected to the load lock chamber provided with a direction-changing function, and the rotary retrieving stock chamber is connected to the unload lock chamber provided with the direction-changing function.

Further alternatively, as shown in FIG. 17, it is also possible to connect the rotary feeding stock chamber 11 to the load lock chamber 2 provided with the direction-changing function, and then connect the rotary retrieving stock chamber 12 to the unload lock chamber 3 provided with the direction-changing function, so that new substrate holders 9 are fed to the load lock chamber 2 and the used substrate holders 9 are retrieved from the unload lock chamber 3. Since the storage processing apparatus for information storage disks 1 shown in FIG. 17 is configured in such a manner that the used substrate holders 9 in the unload lock chamber 3 are retrieved immediately in the rotary retrieving stock chamber 12, and new substrate holders 9 from the rotary feeding stock chamber 11 are fed to the load lock chamber 2, the time required for replacement of the substrate holder 9 can be reduced.

Figure 18:
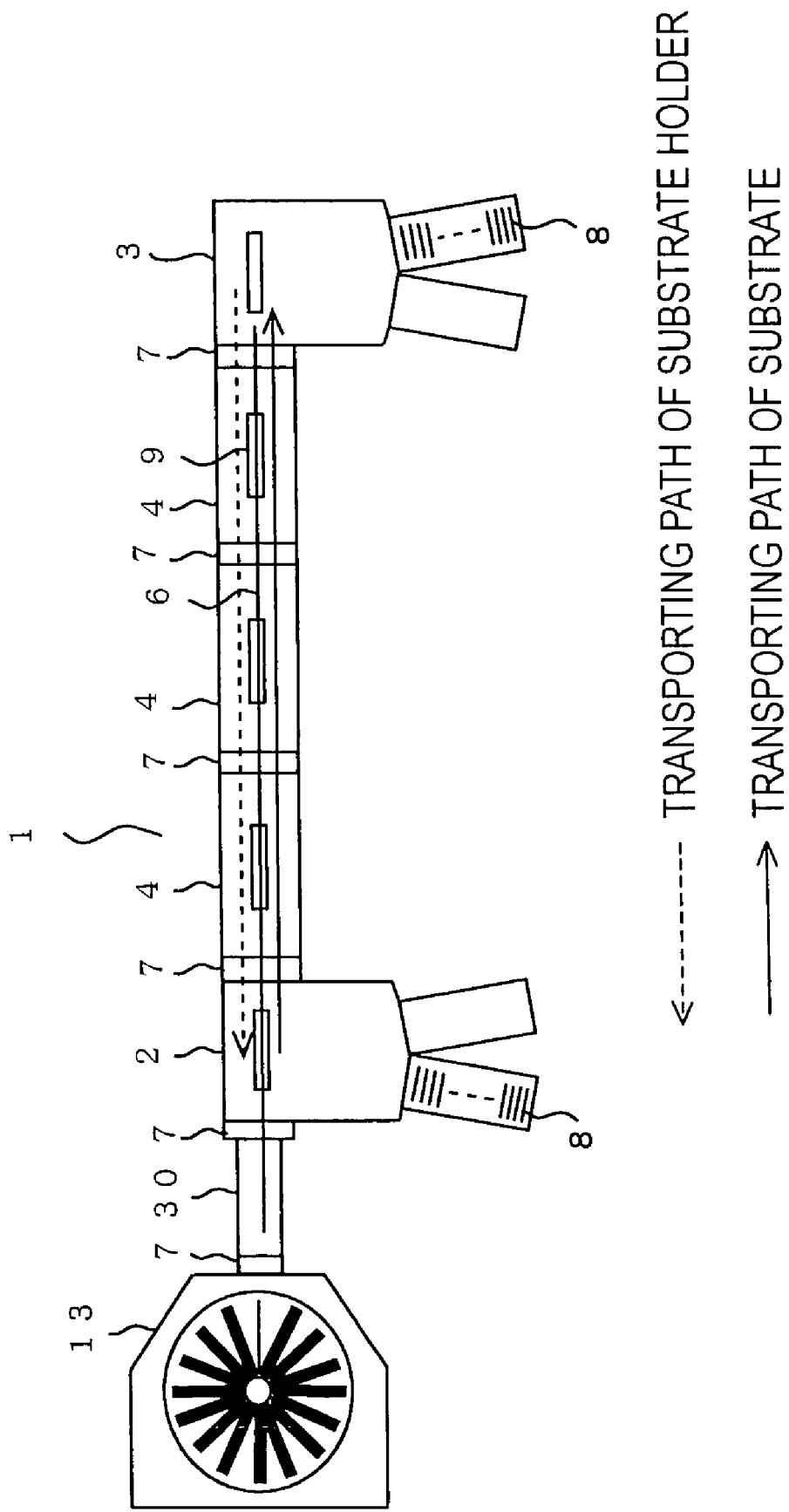
FIG. 18 is a drawing showing the structure of a film forming apparatus, in which the vacuum chambers are arranged linearly for performing feeding and retrieving of the substrate holder by the rotary retrieving and feeding stock chamber 13.
Figure 19:
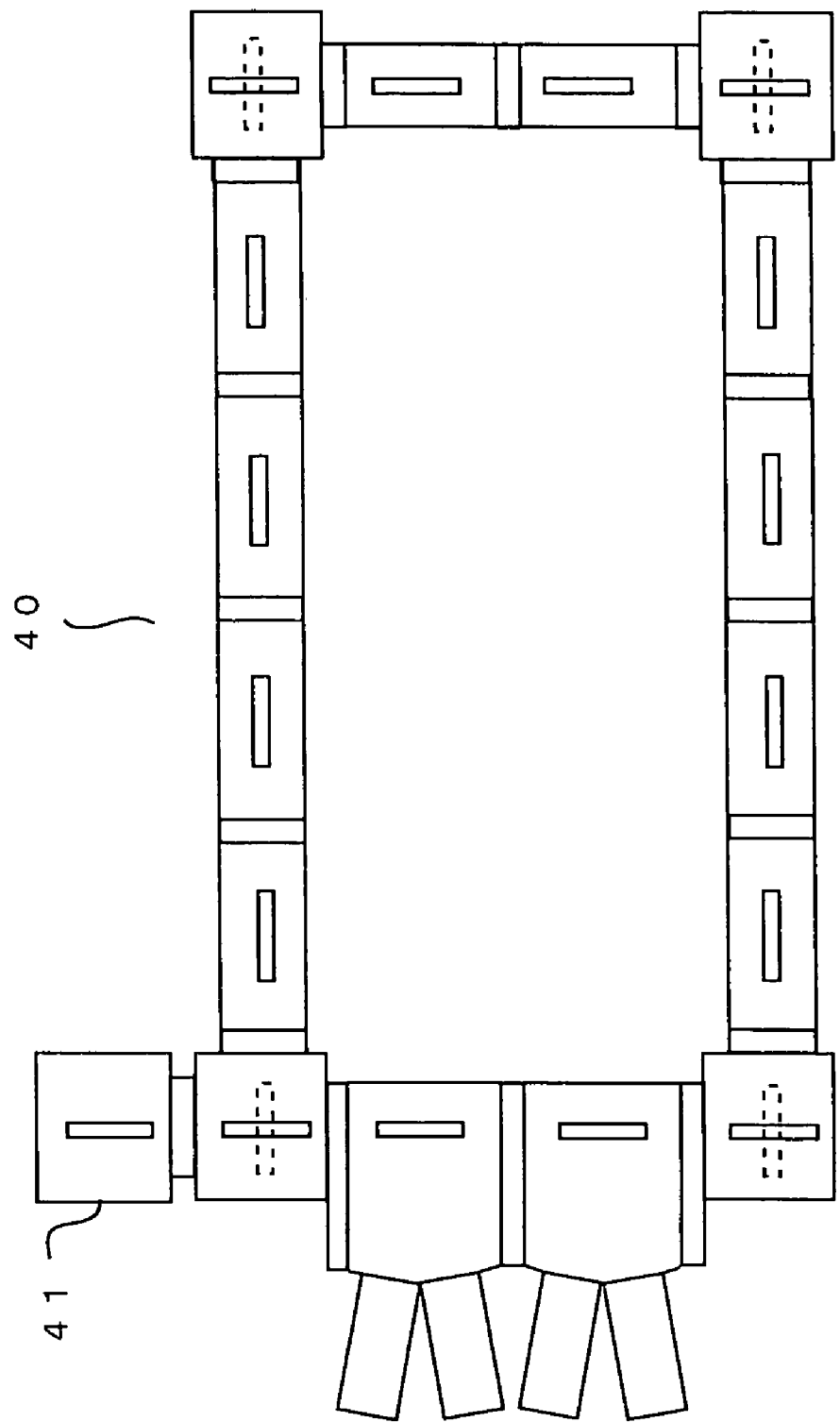
FIG. 19 is a schematic block diagram of a film forming apparatus in the related art in which a film removing chamber is formed so as to be branched from a film forming path.

The film forming apparatus shown in FIG. 18 is configured in such a manner that the vacuum changers 4 are arranged linearly, the rotary retrieving and feeding stock chamber 13 is connected to the load lock chamber 2 via the gate valve 7 and the joint transporting unit 30, and the unload lock chamber 3 is provided at the terminal of the path 6. The substrates 8 are attached to the substrate holders 9 fed from the rotary retrieving and feeding stock chamber 13 in the load lock chamber 2, then, the films are formed in the vacuum chambers 4, and the substrates 8 are retrieved from the substrate holders 9 in the unload lock chamber 3. Then, the substrate holders 9, on which the substrates 8 are not yet attached, move in the direction indicated by an arrow shown by broken line in FIG. 18 and are retrieved in the rotary retrieving and feeding stock chamber 13. Subsequently, new substrate holders 9 are fed to the path 6 from the rotary retrieving and feeding stock chamber 13.

As described thus far, it is also possible to retrieve and feed the substrate holders in the identical stock chamber. More preferably, by performing the same in the separate stock chambers, more efficient replacement of the used substrate holders with the new ones is achieved.

The connection of the stock chamber may be not only with the direction-changing chamber 5, but also with the vacuum chamber 4, the load lock chamber 2 or the unload lock chamber 3. A structure such that the number of stock chambers to be connected and the position of connection in the film forming apparatus can be selected as needed is also applicable.

Furthermore, although the substrate holder stock chamber in the film forming apparatus according to the present application is applied to the film forming apparatus in which the substrate holder is moved in the vertical position, it can also be applied to the film forming apparatus in a system in which the substrate holder is moved in the horizontal position.

The film forming apparatus according to the present application is intended to perform the film forming process efficiently without lowering the productivity when a thick film is accumulated on the substrate holder in the process of a vertical magnetic recording film formation. However, it can be applied to the case of a thin film such as the magnetic recording film formation in the surface (in the longitudinal direction) as a matter of course.

Although the substrate processing apparatus for information storage disk has been described as an example, it can be applied to the film forming apparatus in which the substrate is held on the substrate holder for forming a film, and is not limited to the substrate processing apparatus for information storage disk. The structures, the shapes, or the positional relationships in the embodiment and in the example are only shown schematically to an extent the invention can be understood and implemented. Therefore, the invention is not limited to the embodiment or the example shown here, and may be modified into various modes without departing from the scope of the technical consideration shown in the appended claims.

What is claimed is:

1. A film forming apparatus comprising:
 plurality of vacuum chambers connected in a vacuum state;
 a driving unit for moving a plurality of substrate holders;
 a retrieving stock chamber which is connected to a first vacuum chamber from among the plurality of vacuum chambers for storing a retrieved substrate holder;
 a feeding stock chamber for storing a replenishment substrate holder and feeding the replenishment substrate holder, the feeding stock chamber being connected to a second vacuum chamber from among the plurality of vacuum chambers; and
 a control unit which comprises a computer programmed to: (i) control the driving unit to move each of the substrate holders along a path through the plurality of vacuum chambers, (ii) control the driving unit to move at least one of the substrate holders, when the at least one of the substrate holders is in the first vacuum chamber, off of the path and to the retrieving stock chamber, and (iii) cause the replenishment substrate holder to be fed from the feeding stock chamber to the second vacuum chamber when a position on the path, from which the at least one of the substrate holders has been moved to the retrieving stock chamber, reaches the second vacuum chamber such that the replenishment substrate holder takes the place on the path of the at least one of the substrate holders that has been moved to the retrieving stock chamber.

2. The film forming apparatus according to claim 1, wherein the feeding stock chamber comprises a degasificating mechanism.

3. The film forming apparatus according to claim 1, wherein the retrieving stock chamber comprises a film removing mechanism for removing a film accumulated on a surface of the retrieved substrate holder.

4. The film forming apparatus according to claim 1, wherein the first vacuum chamber and the second vacuum chamber are direction changing chambers which are configured to change a direction of transfer of the substrate holders along the path.

5. The film forming apparatus according to claim 1, wherein the first vacuum chamber is an unload lock chamber which retrieves a substrate from the substrate holder therein, and the second vacuum chamber is a load lock chamber which loads a substrate to the substrate holder therein.

6. The film forming apparatus according to claim 1, wherein the controller which controls respective identification information of the plurality of substrate holders, stores identification information of a substrate holder requiring replacement, and controls the retrieving and feeding of the substrate holders by the retrieving stock chamber and the feeding stock chamber based on the stored identification information.

7. The film forming apparatus according to claim 1, wherein the retrieving stock chamber comprises a storing mechanism which stores substrate holders such that surfaces of the substrate holders are arranged in parallel.

8. The film forming apparatus according to claim 1, wherein the retrieving stock chamber comprises a storing mechanism which stores substrate holders such that the substrate holders are arranged around a center axis of a rotating mechanism.

9. The film forming apparatus according to claim 1, wherein the path forms a closed loop.

10. The film forming apparatus according to claim 1, wherein at least additional one of the vacuum chambers is situated between the first vacuum chamber and the second vacuum chamber such that the position on the path, from which the at least one of the substrate holders has been moved to the retrieving stock chamber, is empty of a substrate holder while passing through the at least one additional vacuum chamber.

11. The film forming apparatus according to claim 1, wherein the driving unit is arranged to move the replenishment substrate holder from the feeding stock chamber to the second vacuum chamber when the position on the path, from which the at least one of the substrate holders has been moved to the retrieving stock chamber, reaches the second vacuum chamber such that the path in which the at least one of the substrate holders has been moved by the driving unit to the retrieving stock chamber is different than the path in which the replenishment substrate holder is placed by the driving unit onto the path.

12. The film forming apparatus according to claim 1, wherein the controller controls the driving unit to only move a substrate holder off of the path from the first vacuum chamber and not to place a substrate holder onto the path via the first vacuum chamber.

13. The film forming apparatus according to claim 1, wherein the controller causes the replenishment substrate holder to be placed onto the path via the second vacuum chamber and not to remove a substrate holder from the path via the second vacuum chamber.

* * * * *